(12) United States Patent
Adachi et al.

(10) Patent No.: US 7,737,604 B2
(45) Date of Patent: Jun. 15, 2010

(54) ULTRASONIC ACTUATOR

(75) Inventors: Yusuke Adachi, Osaka (JP); Hideaki Mukae, Hyogo (JP); Masaru Higashionji, Osaka (JP); Eiichi Nagaoka, Hyogo (JP); Kenichi Honjo, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/469,212

(22) Filed: May 20, 2009

(65) Prior Publication Data

US 2009/0224630 A1 Sep. 10, 2009

Related U.S. Application Data

(63) Continuation of application No. PCT/JP2008/000608, filed on Mar. 17, 2008.

(30) Foreign Application Priority Data

Mar. 16, 2007 (JP) ............................ 2007-068326

(51) Int. Cl.
*H02N 2/14* (2006.01)
(52) U.S. Cl. .............. 310/317; 310/316.01; 310/316.02
(58) Field of Classification Search ............ 310/316.01, 310/316.02, 317
See application file for complete search history.

(56) References Cited

U.S. PATENT DOCUMENTS 4,853,579 A 8/1989 Kawasaki et al.
5,376,855 A 12/1994 Suganuma
5,477,099 A 12/1995 Suganuma
5,479,063 A 12/1995 Suganuma
5,767,609 A * 6/1998 Suganuma ............. 310/316.02
5,821,667 A 10/1998 Takagi et al.

(Continued)

FOREIGN PATENT DOCUMENTS

JP 63-056177 3/1988

(Continued)

OTHER PUBLICATIONS

International Search Report and Written Opinion for corresponding Application No. PCT/JP2008/000608 mailed Jun. 17, 2008.

(Continued)

*Primary Examiner*—Walter Benson
*Assistant Examiner*—Bryan P Gordon
(74) *Attorney, Agent, or Firm*—Renner, Otto, Boisselle & Sklar, LLP

(57) ABSTRACT

An ultrasonic actuator includes: an actuator body (5) including an actuator body (50); a control circuit (150) for setting a driving frequency; power supply sources (191, 192) for applying a driving voltage having the driving frequency to the actuator body; and a memory (170) for storing data related to a difference between antiresonance and resonance frequencies of the actuator body (50). The control circuit (150) determines, based on a reference frequency where a current value of a current fed to the piezoelectric element (50) is local minimum and the data stored in the memory (170), a lower limit of a control range of the driving frequency so that the lower limit is equal to or higher than a frequency where the current value of the current fed to the piezoelectric element (50) is local maximum and determines the driving frequency to be a frequency in the control range.

14 Claims, 16 Drawing Sheets

U.S. PATENT DOCUMENTS

| | | |
|---|---|---|
| 6,252,332 B1 | 6/2001 | Takagi et al. |
| 6,586,860 B1 * | 7/2003 | Iino et al. ............... 310/316.02 |
| 2002/0049427 A1 * | 4/2002 | Wiener et al. ................... 606/1 |
| 2002/0057040 A1 * | 5/2002 | Shibatani ............... 310/323.16 |
| 2005/0116583 A1 | 6/2005 | Nishio et al. |
| 2005/0225202 A1 * | 10/2005 | Vogeley et al. .............. 310/317 |

FOREIGN PATENT DOCUMENTS

| | | |
|---|---|---|
| JP | 03-022871 | 1/1991 |
| JP | 03-239168 | 10/1991 |
| JP | 06-315283 | 11/1994 |
| JP | 07-264882 | 10/1995 |
| JP | 2002-359983 | 12/2002 |
| JP | 2004-304963 | 10/2004 |
| JP | 2005-185085 | 7/2005 |
| JP | 2006-115583 | 4/2006 |
| JP | 2006-304490 | 11/2006 |

OTHER PUBLICATIONS

Form PCT/ISA/237.

* cited by examiner

ULTRASONIC ACTUATOR

CROSS-REFERENCE TO RELATED APPLICATION

This application is a continuation of PCT International Application PCT/JP2008/000608, filed on Mar. 17, 2008, which claims priority on Japanese Patent Application No. 2007-068326, filed on Mar. 16, 2007, the entire disclosures of which are expressly incorporated by reference herein.

TECHNICAL FIELD

The present invention relates to an ultrasonic actuator including an actuator body, having a piezoelectric element, for performing vibration.

BACKGROUND

Conventionally, as an ultrasonic actuator including an actuator having a piezoelectric element, an ultrasonic actuator disclosed in Patent Document 1 has been known.

The ultrasonic actuator of Patent Document 1 includes an actuator body formed of a piezoelectric element and a driver element fixed onto the actuator body.

The actuator body is formed of a flat plate-shaped piezoelectric element having a longitudinal direction. In the actuator body, longitudinal vibration (i.e., so-called expanding/contracting vibration) along a longitudinal direction of the piezoelectric element and bending vibration along a lateral direction of the piezoelectric element are induced in a cooperated manner by respectively applying alternating currents having different phases to two electrode pairs each of which includes two electrodes diagonally arranged. As a result, the driver element makes an orbit motion, more specifically, an elliptical motion in a plane of the piezoelectric element including a longitudinal direction and a lateral direction.

Patent Document 2 discloses an ultrasonic motor (ultrasonic actuator). Patent Document 2 discloses a technique in which in an ultrasonic motor, a driving frequency is set to a higher value than a resonance frequency of the ultrasonic motor and the frequency is reduced from the higher value at a start of driving the ultrasonic motor.

Furthermore, Patent Document 3 discloses a control system for an ultrasonic motor (ultrasonic actuator). Patent Document 3 discloses a technique in which a driving frequency at which a drive current for the ultrasonic motor is minimum is searched and the driving frequency is fixed to the obtained frequency, thereby performing control.

Patent Document 1: Japanese Published Patent Application No. 2004-304963

Patent Document 2: Japanese Published Patent Application No. H7-264882

Patent Document 3: Japanese Published Patent Application No. 2006-115583

SUMMARY

The ultrasonic motor of Patent Document 2 is driven, based on only the resonance frequency. There arises a problem in which an absolute value of the resonance frequency has large variation due to variation in actuator fabrication, variation in material constant of a piezoelectric element and the like and, accordingly, a selection range of the driving frequency to be controlled becomes very wide. When the driving frequency is very low, a current is increased and this increase in current might cause reduction in efficiency and also damage of the element due to heat generation.

In the ultrasonic motor of Patent Document 3, the driving frequency is fixed. Thus, changing a duty ratio of a drive pulse is the only way to change an output such as speed. However, in such a configuration where a duty ratio is changed, a control range thereof becomes very narrow.

In view of the above-described problems, it is an object of the present invention to ensure appropriate driving power and provide an ultrasonic actuator having a wide output control range.

To achieve the object, an ultrasonic actuator includes: an actuator body for performing vibration, the actuator body including a piezoelectric element; a control section for setting a driving frequency of a driving voltage to be applied to the actuator body; a power supply section for applying the driving voltage having the driving frequency set in the control section to the actuator body; and a memory section for storing data related to a difference between an antiresonance frequency and a resonance frequency of the piezoelectric element. In the ultrasonic actuator, the control section determines, based on a reference frequency at which a current value of a current fed to the piezoelectric element is local minimum and the data related to the difference between the antiresonance frequency and the resonance frequency of the piezoelectric element and stored in the memory section, a control range of the driving frequency so that a lower limit of the control range is equal to or higher than a frequency at which the current value of the current fed to the piezoelectric element is local maximum and sets the driving frequency to a value in the control range.

According to the ultrasonic actuator, appropriate driving power can be ensured and a wide output control range can be provided.

BRIEF DESCRIPTION OF THE DRAWINGS

In FIG. 11, (a) shows a drive signal to shift a stage in the A direction of FIG. 10, (b) shows a drive signal to shift the stage in the B direction of FIG. 10 and (c) shows a drive signal to halt the stage.

EXPLANATION OF REFERENCE NUMERALS

| | |
|---|---|
| 3 | Stage (target body to be driven) |
| 4A, 204A and 304A | First ultrasonic actuator (first actuator) |
| 4B, 204B and 304B | Second ultrasonic actuator (second actuator) |
| 5 | Actuator body |
| 59 | Driver element |

DESCRIPTION OF THE PREFERRED EMBODIMENTS

Hereinafter, embodiments of the present invention will be described in detail with reference to the accompanying drawings.

Embodiment 1

Figure 1:
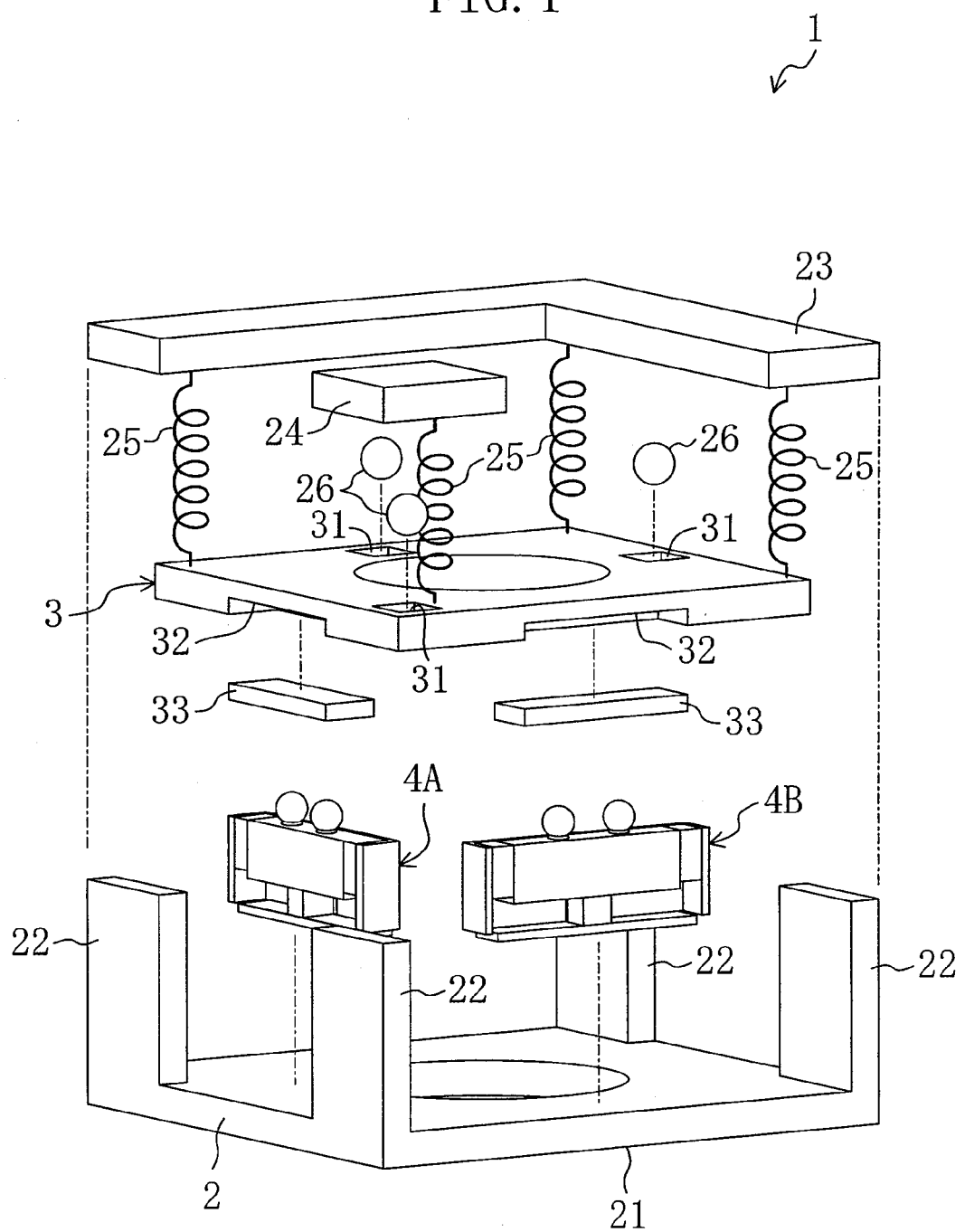
FIG. 1 is an exploded perspective view illustrating a structure of a drive unit according to Embodiment 1.
Figure 2:
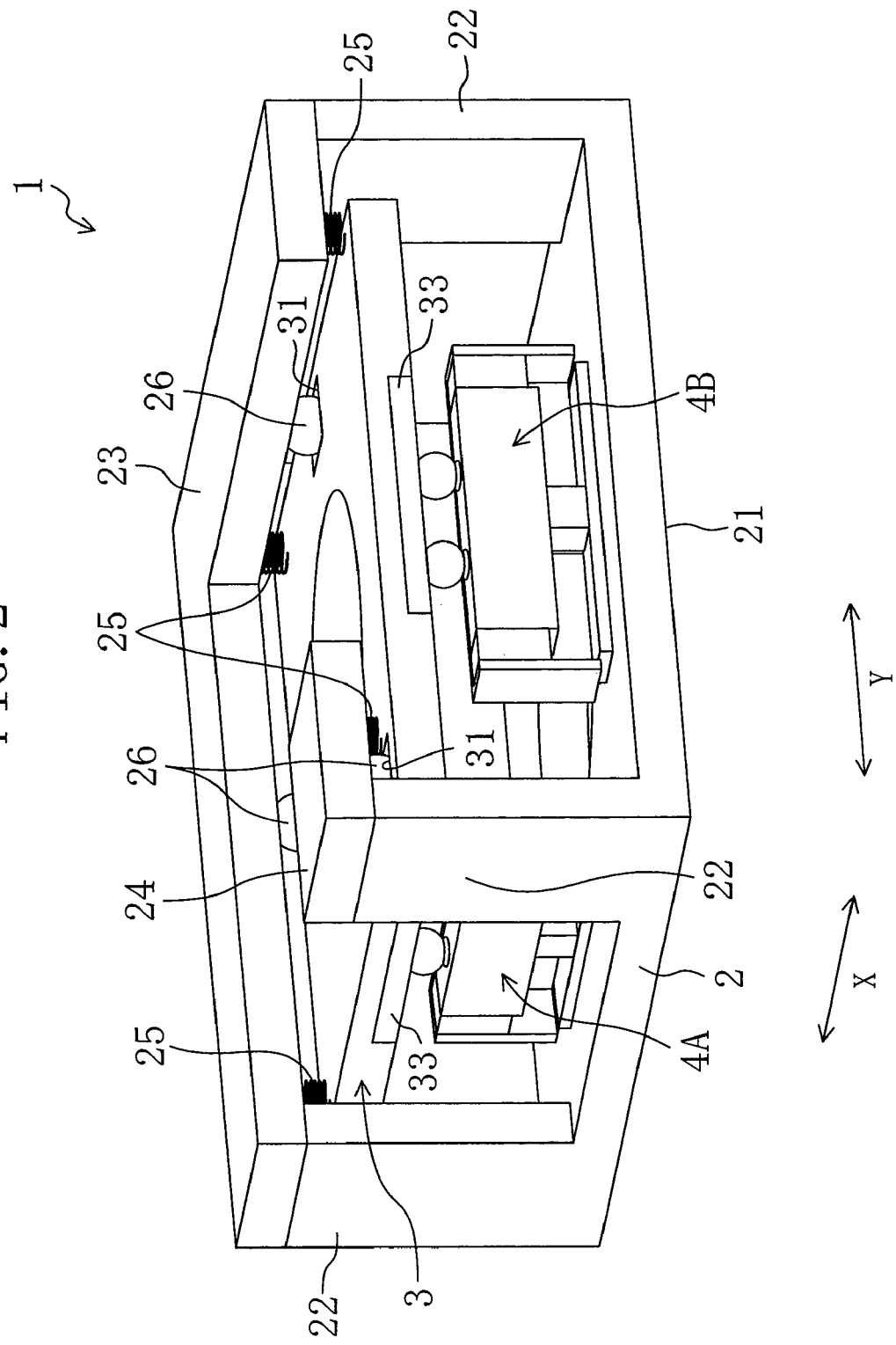
FIG. 2 is a perspective view of a drive unit.

As shown in FIGS. 1 and 2, a drive unit 1 according to Embodiment 1 of the present invention includes a fixed member 2, a stage 3 movably supported relative to the fixed member 2, first and second ultrasonic actuators 4A and 4B for driving the stage 3 and a control unit (not shown) for performing drive control to the first and second ultrasonic actuators 4A and 4B.

The fixed member 2 includes a bottom wall portion 21 having a square shape when viewed from the top, four side wall sections 22 projecting upward from four corners of the bottom wall portion 21, respectively, and a first ceiling wall section 23 which is to be attached to end portions of three of the side wall sections 22 so as to be opposed to the bottom wall portion 21, and a second ceiling wall section 24 which is to be attached to an end portion of the other one of the side wall sections 22 so as to be opposed to the bottom wall portion 21. The side wall sections 22 are formed so that each of side edge potions of the bottom wall portion 21 which are opposed to each other as a pair has two of the side wall sections 22 provided thereon. The two side wall sections 22 provided on each of the pair of side edge portions of the bottom wall portion 21 are located on both ends of each of the side edge portions, respectively. The first ceiling wall section 23 is a flat plate member having an approximately L shape when viewed from the top and extending over the end portions of the three side wall sections 22. The second ceiling wall section 24 is a flat plate member having an approximately square shape when viewed from the top.

The stage 3 is a metal flat plate member having a square shape when viewed from the top. The stage 3 is placed in the fixed member 2 so as to be spaced from the side wall sections 22. The stage 3 may be formed of resin such as polycarbonate or the like. The stage 3 constitutes a target body to be driven.

In one side edge portion at a lower surface of the stage 3 and one of two other side edge portions at the lower surface each of which is perpendicular to the side edge portion, openings are respectively provided so that each of the openings extends from the lower surface to a side surface of the stage 3, thereby providing concave portions 32. Ceramic reinforcing members 33 are inserted in and bonded to the concave portions 32, respectively. The reinforcing members 33 are arranged so as to be flush with the lower surface of the stage 3. The reinforcing members 33 are not limited to ceramic-made members but may be members made of any material having abrasion resistance.

The stage 3 is supported at its four corners by support springs 25 with respect to the first ceiling wall section 23 and the second ceiling wall section 24. In this state, metal round rolling elements 26 (three rolling elements in this embodiment) are provided between the stage 3, and each of the first ceiling wall section 23 and the second ceiling wall section 24. On an upper surface of the stage 3 (which is a surface opposed to the first ceiling wall section 23 and the second ceiling wall section 24), receiving holes 31 are formed to restrict relative displacement of the rolling elements 26 with respect to the stage 3. The rolling elements 26 are placed in the receiving holes 31, respectively, and are in contact with respective lower surfaces of the first ceiling wall section 23 and the second ceiling wall section 24. More specifically, two of the rolling elements 26 are interposed between the stage 3 and the first ceiling wall section 23 and the other one of the rolling elements 26 is interposed between the stage 3 and the second ceiling wall section 24. Thus, the stage 3 is formed so as to be bias-supported with certain space from the first ceiling wall section 23 and the second ceiling wall section 24 and also to be movable in parallel to the upper and lower surfaces of the stage 3 with the rolling elements 26 interposed between the stage 3 and each of the first ceiling wall section 23 and the second ceiling wall section 24.

Figure 3:
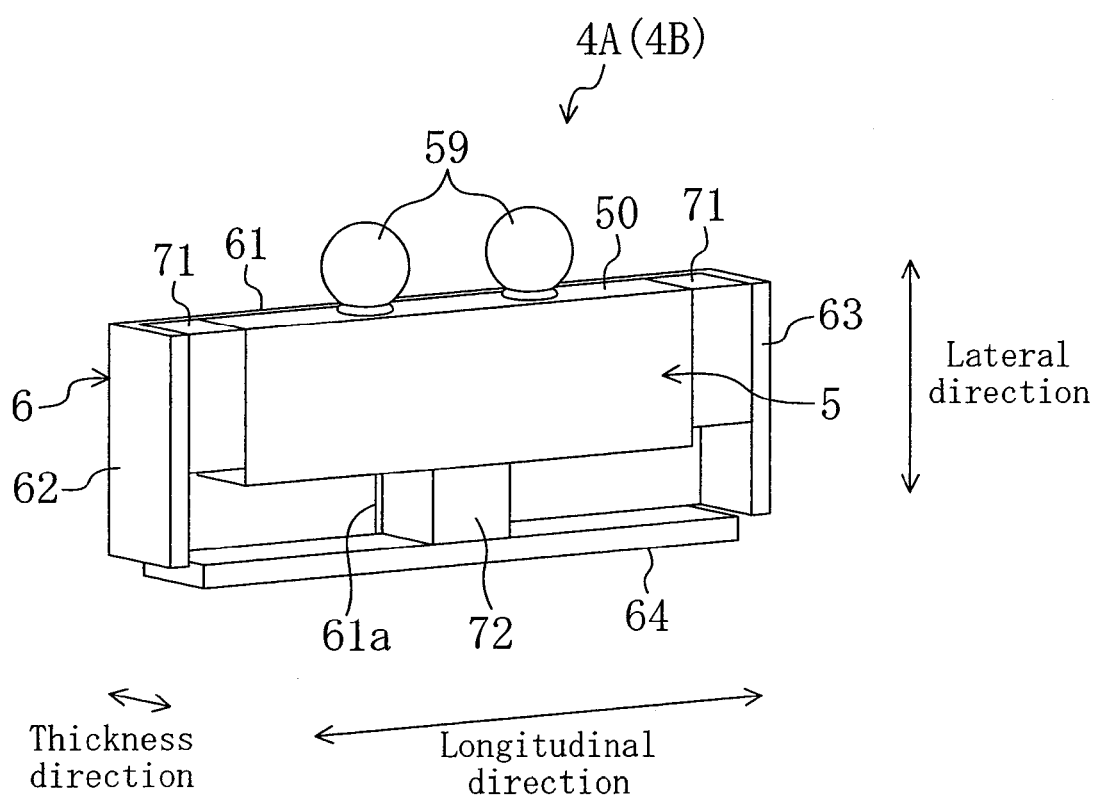
FIG. 3 is a perspective view of an ultrasonic actuator.

The first and second ultrasonic actuators 4A and 4B have the same structure. As shown in FIG. 3, each ultrasonic actuator 4A (4B) includes an actuator body 5 for generating vibration, driver elements 59 for transmitting driving force of the actuator body 5 to the stage 3, a case 6 for housing the actuator body 5, support rubbers 71, provided between the actuator body 5 and the case 6, for elastically supporting the actuator body 5 and a bias rubber 72 for biasing the actuator body 5 to the stage 3.

The actuator body 5 is formed of a piezoelectric element 50.

The piezoelectric element 50 has an approximately rectangular parallelepiped shape including a pair of principal surfaces each having an approximately rectangular shape and being opposed to each other, a pair of long side surfaces each being perpendicular to each of the principal surfaces, extending along longitudinal directions of the principal surfaces and being opposed to each other, and a pair of short side surfaces each being perpendicular to each of the principal surfaces and the long side surfaces and extending along lateral directions of the principal surfaces.

Figure 4:
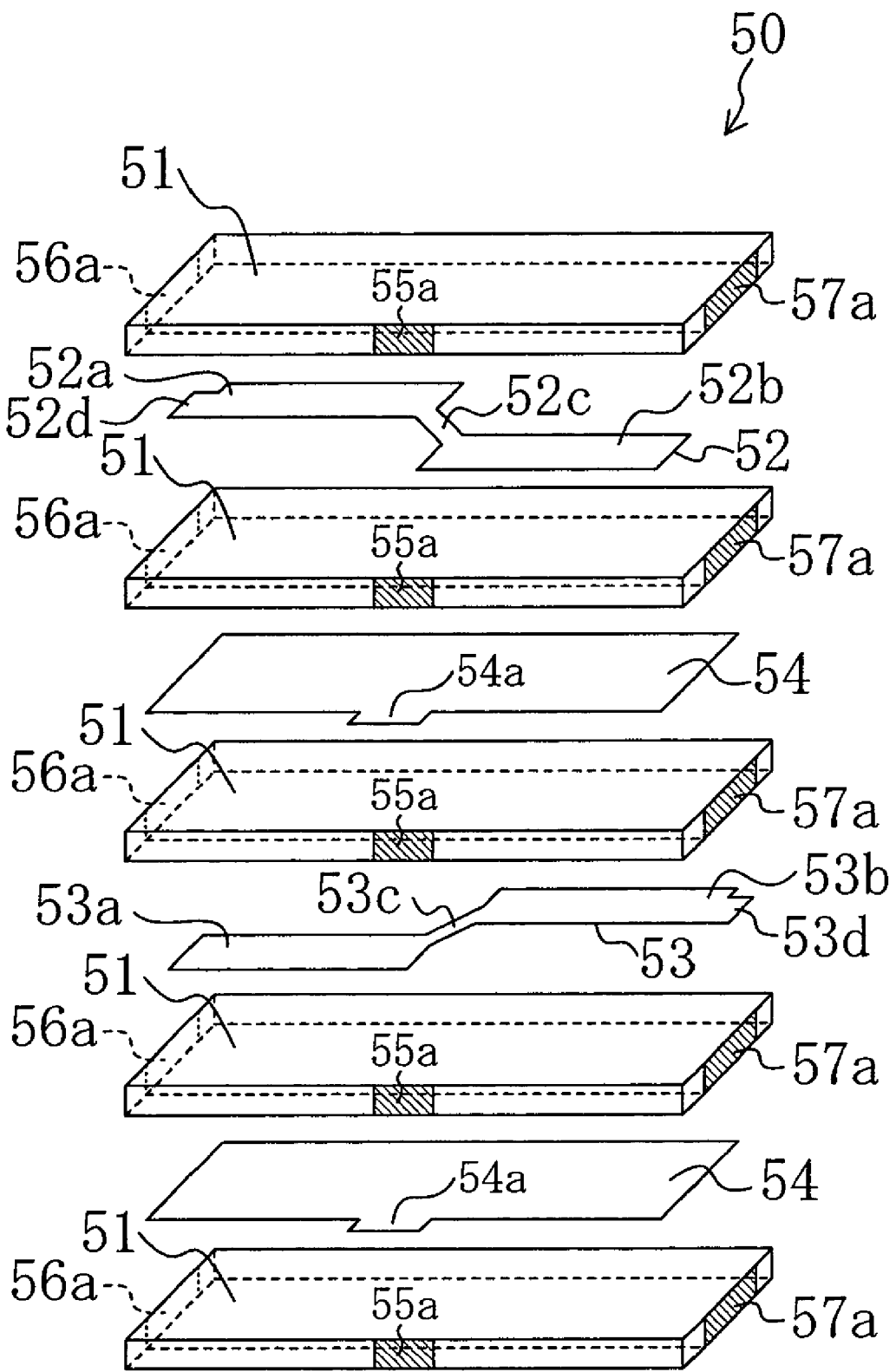
FIG. 4 is an exploded perspective view of a piezoelectric element.

As shown in FIG. 4, the piezoelectric element 50 includes five piezoelectric element layers 51 and four internal electrode layers 52, 54, 53 and 54, which are alternately stacked. Specifically, the internal electrode layers 52, 54, 53 and 54 are, respectively, formed of a first power supply electrode layer 52, a common electrode layer 54, a second power supply electrode layer 53 and another common electrode layer 54 which are alternately provided in a stacking direction with each of the piezoelectric element layers 51 interposed between any two of the internal electrode layers. Each of the first power supply electrode layer 52, the second power supply electrode layer 53 and the common electrode layers 54 is printed on an associated one of the piezoelectric element layers 51.

Each of the piezoelectric element layers 51 is an insulation layer, for example, formed of a ceramic material such as lead zirconate titanate and has an approximately rectangular parallelepiped shape including a pair of principal surfaces, a pair of long side surfaces and a pair of short side surfaces in the same manner as the piezoelectric element 50. Moreover, an external electrode 55a is formed in center part of a long side surface in the longitudinal direction, in which the driver elements 59 are not provided, an external electrode 56a is formed in center part of one short side surface in the lateral direction, and an external electrode 57a is formed in center part of the other short side surface in the lateral direction.

Each of the common electrode layers 54 has an approximately rectangular shape provided approximately on an entire principal surface of an associated one of the piezoelectric element layers 51. Moreover, a lead electrode 54a is formed in one long side portion of each of the common electrode layers 54 so as to extend from center part of the common electrode layer 54 in the longitudinal direction thereof to the external electrode 55a of the piezoelectric element layer 51.

Figure 5:
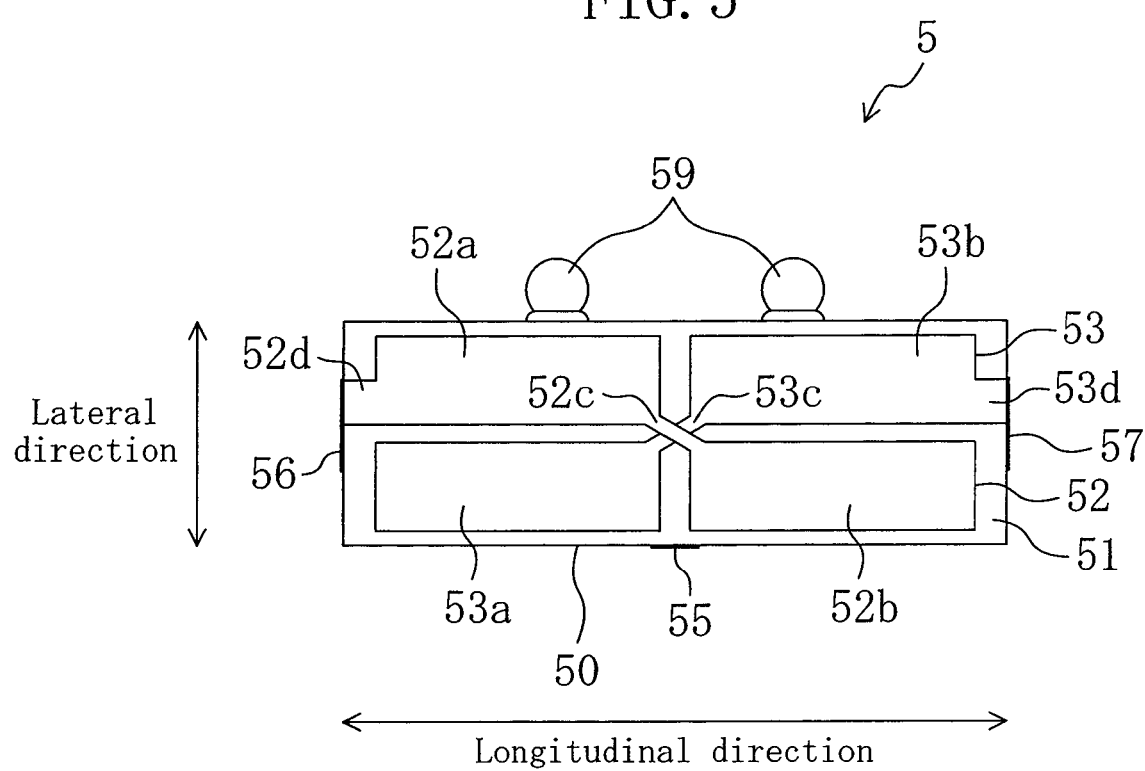
FIG. 5 is a schematic front view illustrating a structure of an actuator body.

Suppose that the principle surface of each of the piezoelectric element layers 51 is divided in four areas, i.e., two areas in the longitudinal direction and two areas in the lateral direction. As shown in FIG. 5, the first power supply electrode layer 52 includes first electrodes 52a and 52b respectively formed in one pair of the areas located in one diagonal direction of the principal surface, and a conductive electrode 52c for connecting the first electrodes 52a and the 52b to bring them in conduction. Each first electrode 52a (52b) is an electrode having an approximately rectangular shape and overlaps with the common electrode layers 54 when viewed in the stacking direction. That is, each first electrode 52a (52b) is opposed to an associated one of the common electrode layers 54 with an associated one of the piezoelectric element layers 51 interposed therebetween. One of the first electrodes 52a and 52b, i.e., the first electrode 52a is provided with a lead electrode 52d extending to the external electrode 56a of the piezoelectric element layer 51.

The second power supply electrode layer 53 includes a pair of second electrodes 53a and 53b respectively formed in the other pair of the areas located in the other diagonal direction of the principal surface, and a conductive electrode 53c for connecting the second electrodes 53a and the 53b to bring them in conduction. When viewed in the stacking direction, the second electrode 53a is provided in one area of the other pair, which is located adjacent to the first electrode 52a in the lateral direction and adjacent to the first electrode 52b in the longitudinal direction, and the second electrode 53b is provided in the other area of the same pair, which is located adjacent to the first electrode 52a in the longitudinal direction and adjacent to the first electrode 52b in the lateral direction. Each second electrode 53a (53b) is an electrode having an approximately rectangular shape and overlaps with the common electrode layers 54, when viewed in the stacking direction. That is, each second electrode 53a (53b) is opposed to an associated one of the common electrode layers 54 with an associated one of the piezoelectric element layers 51 interposed therebetween. Moreover, one of the first electrodes 53a and 53b, i.e., the second electrode 53b is provided with a lead electrode 53d extending to the external electrode 57a of the piezoelectric element layer 51.

In the piezoelectric element 50 formed by alternately stacking the piezoelectric element layers 51 and the internal electrode layers 52, 54, 53 and 54, the respective external electrodes 55a of the piezoelectric element layers 51 align in the stacking direction in center part of one long side surface thereof in the longitudinal direction, thereby forming an integrated external electrode 55. The lead electrodes 54a provided to the common electrode layers 54 are electrically connected to the integrated external electrode 55. In the same manner, the respective external electrodes 56a of the piezoelectric element layers 51 align in the stacking direction in center part of one short side surface of the piezoelectric element 50 in the lateral direction, thereby forming an integrated external electrode 56. The lead electrode 52d of the first power supply electrode layer 52 is electrically connected to the integrated external electrode 56. Furthermore, the respective external electrode 57a of the piezoelectric element layers 51 align in the stacking direction in center part of the other short side surface of the piezoelectric element 50 in the lateral direction, thereby forming an integrated external electrode 57. The lead electrode 53d of the second power supply electrode layer 53 is electrically connected to the integrated external electrode 57.

On the other long side surface of the piezoelectric element 50 in which the external electrodes 55a are not provided, the driver elements 59 are provided to align in the longitudinal direction so as to be spaced apart from each other. The driver elements 59 are provided in parts of the long side surface located at a distance of 30% to 35% of the full length of the long side surface inwardly from both edges in the longitudinal direction, respectively. Each of the locations of the driver elements 59 corresponds to a loop of a second mode of bending vibration where vibration is maximum. Each of the driver elements 59 has an approximately spherical phase and is formed of a hard material such as ceramic and the like.

Figure 6:
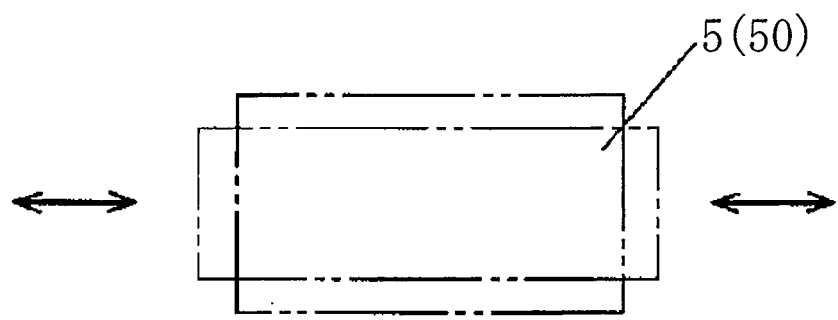
FIG. 6 is a conceptual diagram illustrating displacement made by a first mode of longitudinal vibration of a piezoelectric element.
Figure 7:
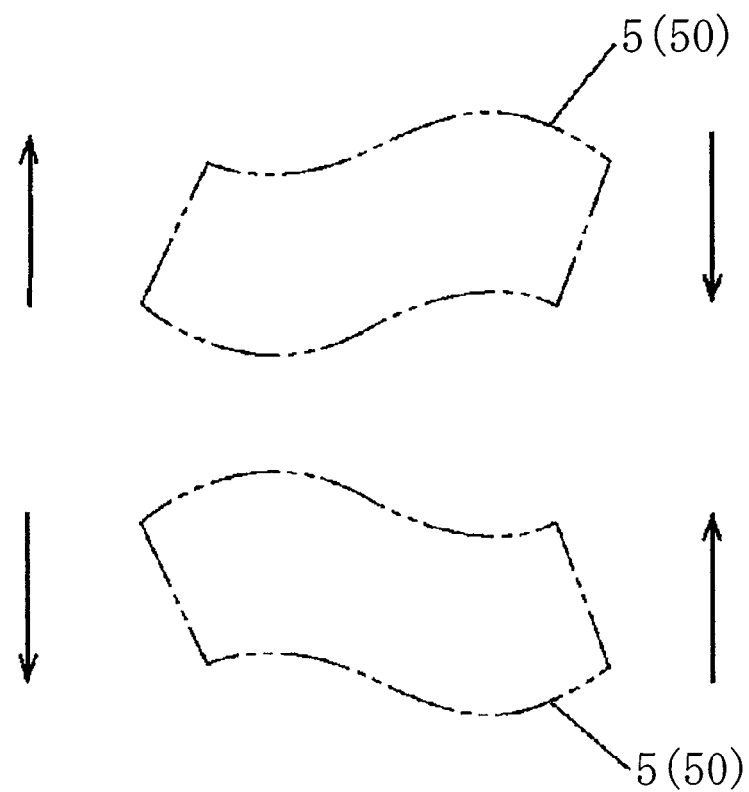
FIG. 7 is a conceptual diagram illustrating displacement made by a second mode of bending vibration of a piezoelectric element.

The external electrode 55 is connected to the ground. An alternating voltage at a predetermined frequency is applied to the external electrode 56. An alternating voltage of a phase shifted from the phase of the alternating voltage by 90° is applied to the external electrode 57. Thus, alternating voltages which have different phases from each other by 90° are applied to the one pair of the first electrodes 52a and 52b and the other pair of the second electrode 53a and 53b, respectively, each of which is located in an associated one of the diagonal directions of the principal surface of each piezoelectric element layer 51, so that a first mode of longitudinal vibration (i.e., so-called expanding/contracting vibration) shown in FIG. 6 and a second mode of bending vibration shown in FIG. 7 are induced.

Respective resonance frequencies of longitudinal vibration and bending vibration are determined by a material, a shape and the like of the piezoelectric element 50. Furthermore, the resonance frequencies both are influenced by force supporting the piezoelectric element 50 and a position where the piezoelectric element 50 is supported. Taking this into consideration, the resonance frequencies are substantially matched to each other. Alternating voltages having a frequency around the resonance frequencies and phases shifted by 90° from each other are applied to the external electrodes 56 and 57, respectively. Thus, the first mode of longitudinal vibration and the second mode of bending vibration are harmonically induced in the piezoelectric element 50, so that the piezoelectric element 50 changes itself into shapes shown in FIGS. 8A, 8B, 8C and 8D in this order.

Figure 8:
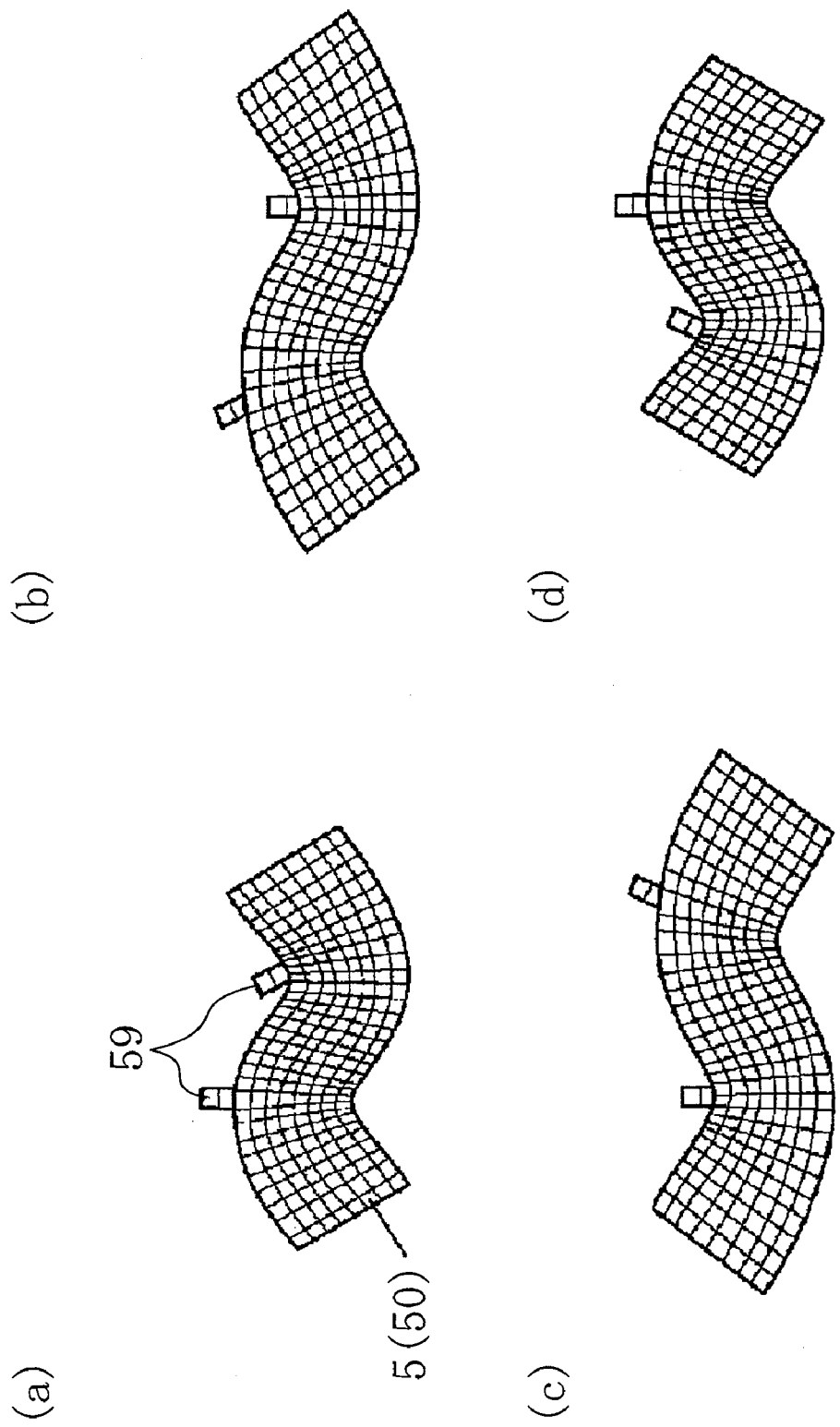
FIG. 8 is a conceptual diagram illustrating the operation of a piezoelectric element.

As a result, each of the driver elements 59 provided to the piezoelectric element 50 makes an approximately elliptical motion in a plane parallel to a principal surface of the piezoelectric element 50 (i.e., a plane parallel to the drawing sheet of FIG. 8).

The case 6 is formed of resin and has an approximately rectangular parallelepiped box shape corresponding to the piezoelectric element 50. The case 6 includes a principal wall portion 61 which is parallel to the principal surface of the piezoelectric element 50 and has an approximately rectangular shape, a first short side wall portion 62 provided at a short side portion located at one side in the longitudinal direction (i.e., the left side of FIG. 3) of the principal wall portion 61, a second short side wall portion 63 provided at a short side portion located at the other side in the longitudinal direction (i.e., the right side of FIG. 3) of the principal wall portion 61, and a long side wall portion 64 provided at a long side portion located at one side in the lateral direction (i.e., the lower side of FIG. 3) of the principal wall portion 61. That is, no wall portion is provided at a plane opposed to the principal wall portion 61 and a long side portion (corresponding to the long side surface of the piezoelectric element 50 on which the driver elements 59 are provided) of the case 6 located at the other side in the lateral direction (i.e., the upper side of FIG. 3) of the principal wall portion 61, so that the case 6 is open at the above-described one side in the thickness direction (in the normal direction of the principal wall portion 61) and at the above-described other side of the lateral direction.

The actuator body 5 is placed in the case 6 having the above-described structure. Specifically, the actuator body 5 is placed in the case 6 so that one of the principal surfaces of the piezoelectric element 50 is in contact with the principal wall portion 61 and one of the long side surfaces of the piezoelectric element 50 (at which the external electrode 55 is provided) is opposed to the long side wall portion 64. In this state, the driver elements 59 stick out from the case 6 at the above-described other side in the lateral direction. The support rubbers 71 are provided between the one of the short side surfaces of the piezoelectric element 50 and the first short side wall portion 62 of the case 6 and between the other one of the short side surfaces of the piezoelectric element 50 and the second short side wall portion 63 of the case 6, respectively. Because the support rubbers 71 are elastic, the piezoelectric element 50 can be supported without damping longitudinal vibration of the piezoelectric element 50 although each of the side surfaces of the piezoelectric element 50 corresponds to a loop of longitudinal vibration. The support rubbers 71 are in contact with not only the actuator body 5 and the first and second short side wall portions 62 and 63 but also an inner surface of the principal wall portion 61. Moreover, the bias rubber 72 is provided between one of the long side surfaces of the piezoelectric element 50 and the long side wall portion 64 of the case 6. The bias rubber 72 is in contact with not only the actuator body 5 and the long side wall portion 64 but also the inner surface of the principal wall portion 61.

Electrodes 61a are provided in parts of the inner surface of the principal wall portion 61 in which the support rubbers 71 and the bias rubber 72 are in contact (only the electrodes 61a in contact with the bias rubber 72 is shown). The electrodes 61a are in conduction with terminal electrodes (not shown) provided on an outer surface of the principal wall portion 61, respectively.

Each of the support rubbers 71 is formed of conductive rubber obtained by mixing metal particles into silicone rubber and has an approximately rectangular parallelepiped shape. The support rubbers 71 elastically support the actuator body 5 with the actuator body 5 biased in the longitudinal direction thereof. Also, the support rubbers 71 bring the external electrodes 56 and 57 of the piezoelectric element 50 into conduction with electrodes which are provided at the short side portions of the inner surface of the principal wall portion 61 and are conductive with the terminal electrodes, respectively.

The bias rubber 72 is also formed of conductive rubber obtained by mixing metal particles into silicone rubber and has an approximately rectangular parallelepiped shape in the same manner as the support rubbers 71. The bias rubber 72 biases the actuator body 5 in the lateral direction thereof (i.e., the lateral direction corresponds to a bias direction). The bias rubber 72 also brings the external electrode 55 of the piezoelectric element 50 into conduction with the electrode 61a of the principal wall portion 61.

That is, power can be supplied to the piezoelectric element 50 by supplying power to the terminal electrodes provided on the outer surface of the case 6.

The first and second ultrasonic actuators 4A and 4B having the above-described structure are provided between the stage 3 and the bottom wall portion 21 of the fixed member 2. The first and second ultrasonic actuators 4A and 4B are arranged so that the long side wall portion 64 of the case 6 is fixed to the bottom wall portion 21 of the fixed member 2 and the driver elements 59 are in contact with a lower surface of the stage 3. That is, the first and second ultrasonic actuators 4A and 4B are arranged so that the lateral direction of the piezoelectric element 50 is perpendicular to the lower surface of the stage 3 and the longitudinal direction of the piezoelectric element 50 is in parallel to the lower surface of the stage 3. In other words, the first and second ultrasonic actuators 4A and 4B are arranged so that the direction of bending vibration of the piezoelectric element 50 is perpendicular to the lower surface of the stage 3 and the direction of longitudinal vibration of the piezoelectric element 50 is in parallel to the lower surface of the stage 3.

In this state, the bias rubber 72 is compressed and deformed and the driver elements 59 are biased against the reinforcing members 33 by elastic force of the bias rubber 72. Bias force of each ultrasonic actuator 4A (4B) to the stage 3 is determined by the elastic force of the bias rubber 72.

Note that in this embodiment, the driver elements 59 are in contact with respective lower surfaces of the reinforcing members 33, respectively, at the lower surface of the stage 3. With the reinforcing members 33 provided, the abrasion resistance of the lower surface of the stage 3 is improved.

Figure 9:
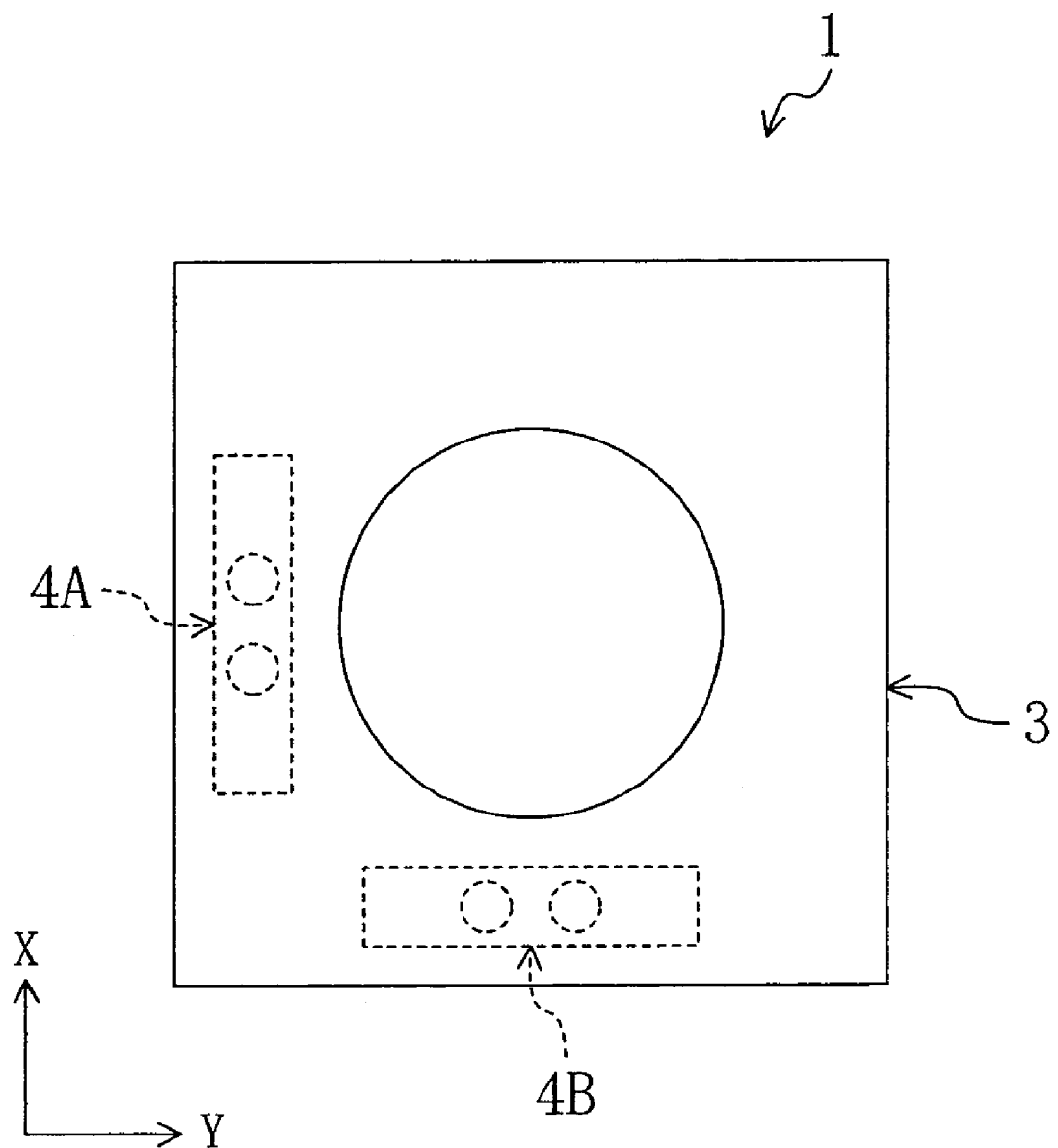
FIG. 9 is a schematic plan view illustrating an arrangement of an ultrasonic actuator.

More specifically, as shown in FIG. 9, the first ultrasonic actuator 4A is arranged in vicinity of one side edge portion of the lower surface of the stage 3 so that the longitudinal direction of the piezoelectric element 50 (i.e., a vibration direction of longitudinal vibration) is in parallel to the side edge portion (this direction is referred to as an X direction). On the other hand, the second ultrasonic actuator 4B is arranged in vicinity of another side edge portion of the lower surface of the stage 3 which is perpendicular to the above-described one side edge portion so that the longitudinal direction of the piezoelectric element 50 is in parallel to the side edge portion (this direction is referred to as a Y direction). In this manner, the first and second ultrasonic actuators 4A and 4B are arranged so that the longitudinal directions of the respective piezoelectric elements 50 are perpendicular to each other when viewed from the top. The first ultrasonic actuator 4A constitutes a first actuator and the second ultrasonic actuator 4B constitutes a second actuator. Furthermore, the X direction corresponds to a first driving direction and the Y direction corresponds to a second driving direction.

Hereinafter, a method for assembling the drive unit 1 will be described.

First, the first and second ceiling wall sections 23 and 24 of the fixed member 2 are attached to the respective end portions of the side wall sections 22.

Next, the rolling elements 26 are provided in the receiving holes 31 of the stage 3 and then the stage 3 is attached to the first and second ceiling wall sections 23 and 24 of the fixed member 2 by the support springs 25.

Subsequently, the first and second ultrasonic actuators 4A and 4B are provided between the bottom wall portion 21 of the fixed member 2 and the stage 3. In a state where the stage 3 is attached to the fixed member 2, a distance from the upper surface of the bottom wall portion 21 of the fixed member 2 to the lower surface of the stage 3 is shorter than a length of each of the first and second ultrasonic actuators 4A and 4B in the lateral direction. Then, in a state where the actuator body 5 is pressed toward the long side wall portion 64 of the case 6 and the bias rubber 72 is compressed and deformed, each ultrasonic actuator 4A (4B) is provided between the bottom wall portion 21 of the fixed member 2 and the stage 3. After each ultrasonic actuator 4A (4B) is placed in a desired location, the case 6 is fixed against the bottom wall portion 21 of the fixed member 2 and signal lines (not shown) are connected to the terminal electrodes provided on the outer surface of the case 6 from a control system (not shown). In this state, the driver elements 59 of each ultrasonic actuator 4A (4B) are in contact with the reinforcing members 33 of the stage 3.

—Operation of Drive Unit—

Next, the operation of the drive unit 1 having the above-described structure will be described.

As described above, in each of the first and the second ultrasonic actuators 4A and 4B, the external electrode 55 is connected to the ground via the terminal electrodes of the case 6 and an alternating voltage at a predetermined frequency and an alternating voltage having a phase shifted from the phase of the alternating voltage by 90° are applied to the external electrode 56 and the external electrode 57, respectively. Accordingly, the piezoelectric element 50 generates composite vibration of longitudinal vibration and bending vibration, thereby having the driver elements 59 make an approximately elliptical motion in a plane parallel to the principal surfaces of the piezoelectric element 50. Thus, while the driver elements 59 periodically repeat contact and separation with and from the stage 3, the stage 3 is moved by frictional force along a longitudinal direction of the piezoelectric element 50. That is, the first and second ultrasonic actuators 4A and 4B apply driving force to the stage 3 along the longitudinal direction of the piezoelectric element 50. As shown in FIGS. 8A through 8D, the two driver elements 59 of each of the actuators make an approximately elliptical motion with their respective phases shifted from each other by 180° and accordingly the stage 3 is driven alternately by the driver elements 59. In Embodiment 1, the first ultrasonic actuator 4A moves the stage 3 in the X direction and the second ultrasonic actuator 4B moves the stage 3 in the Y direction.

Then, a movement in the X direction and a movement in the Y direction are combined by adjusting respective moving distances of the stage 3 by the first ultrasonic actuator 4A and the second ultrasonic actuator 4B, so that the stage 3 can be moved in any direction in a plane parallel to the lower surface of the stage 3 (which is, specifically, the lower surface of the reinforcing members 33). More specifically, the moving distance by each ultrasonic actuator 4A (4B) can be adjusted by adjusting at least one of a voltage value, a frequency and a supply time of an alternating voltage to be supplied to each of the external electrodes 56 and 57, or by changing an amount of the shift between phases of alternating voltages to be supplied to the external electrode 56 and the external electrode 57, respectively, to some other value than 90°. In moving the stage 3 by combining the movement in the X direction and the movement in the Y direction in the above-described manner, the first ultrasonic actuator 4A and the second ultrasonic actuator 4B may be simultaneously driven to move the stage 3 toward a desired location. Also, the first ultrasonic actuator 4A and the second ultrasonic actuator 4B may be alternately driven to move the stage 3 separately in the X direction and in the Y direction so that the stage 3 finally reaches a desired location.

Next, the case where the stage 3 is moved in only one of the X direction and the Y direction will be described. For example, in moving the stage 3 only in the X direction, the first ultrasonic actuator 4A causes the piezoelectric element 50 to generate composite vibration of longitudinal vibration and bending vibration to apply driving force to the stage 3, while the second ultrasonic actuator 4B causes the piezoelectric element 50 to generate vibration substantially only in a plane parallel to the lower surface of the stage 3 (specifically, the lower surface of the reinforcing members 33), i.e., generate only longitudinal vibration, thereby sliding the driver elements 59 with respect to the stage 3.

Specifically, the same alternating voltage is applied to the external electrode 56 and the external electrode 57 of the ultrasonic actuator 4B. That is, alternating voltages having the same phase are applied to the first electrodes 52a and 52b and the second electrodes 53a and 53b (see FIG. 5) of the piezoelectric element 50. Thus, four areas in the piezoelectric element 50 corresponding to the electrodes simultaneously expand and contract and thus, substantially only longitudinal vibration shown in FIG. 5 is induced in the piezoelectric element 50. In this state, in longitudinal vibration of FIG. 5, the piezoelectric element 50 slightly vibrates along the lateral direction thereof as well, but this vibration along the lateral direction is so small as to be ignorable, compared to longitudinal vibration along the longitudinal direction. That is, "substantially" means here that some other type of vibration exists but the size of the vibration is so small as to be ignorable.

As a result, friction force between the second ultrasonic actuator 4B and the stage 3 can be reduced, so that the stage 3 can be efficiently moved in the X direction by the first ultrasonic actuator 4A.

Hereinafter, this point will be explained in detail. Assume that in moving the stage 3 only in the X direction, the second ultrasonic actuator 4B is kept in a halt state and only the first ultrasonic actuator 4A is driven. In this case, even though the actuator body 5 of the second ultrasonic actuator 4B is in a halt state, the actuator body 5 is biased against the stage 3 and thus friction force between each of the driver elements 59 of the second ultrasonic actuator 4B and the stage 3 restricts driving of the stage 3 in the X direction by the first ultrasonic actuator 4A. Particularly, friction force between each of the driver elements 59 and the stage 3 is static friction until the stage 3 starts moving and, therefore, large driving force is needed at a time when the stage 3 starts moving. As shown in this embodiment, in the structure in which the stage 3 is driven by two ultrasonic actuators, the driving direction by the one ultrasonic actuator 4A (4B) is a direction which causes a moment of which a center is the driver elements 59 of the other ultrasonic actuator 4B (4A). Accordingly, if friction force between each of the driver elements 59 of the other ultrasonic actuator 4B (4A) is large, the stage 3 might rotate with the driver elements 59 of the second ultrasonic actuator 4B being centered.

In contrast, in Embodiment 1, when the first ultrasonic actuator 4A is driven, the second ultrasonic actuator 4B causes the piezoelectric element 50 to generate substantially only longitudinal vibration at the same time of driving the first ultrasonic actuator 4A or even before driving the first ultrasonic actuator 4A. As a result, the driver elements 59 slide with respect to the lower surface of the stage 3 and a friction state between each of the driver elements 59 and the lower surface of the stage 3 is changed from static friction to dynamic friction, thus reducing friction force.

Moreover, the driver elements 59 vibrate in parallel to the lower surface of the stage 3. Therefore, the sliding speed of the driver elements 59 with respect to the lower surface of the stage 3 is increased and thus a dynamic friction coefficient is reduced. As a result, compared to a dynamic friction state in which only the stage 3 is moved with respect to the driver elements 59 being in a halt state, dynamic friction force can be reduced.

Furthermore, since the driver elements 59 vibrate substantially in a plane parallel to the lower surface of the stage 3, bias force of the driver elements 59 against the stage 3 is not increased, i.e., friction force is not increased. Note that the piezoelectric element 50 slightly expands and contracts along the lateral direction (which is perpendicular to the lower surface of the stage 3) as it expands and contracts along the longitudinal direction (which is parallel to the lower surface of the stage 3). However, the expanding and contracting along the lateral direction is very small, compared to the expanding and contracting along the longitudinal direction, and thus hardly affects the stage 3.

In the above-described manner, friction force between each of the driver elements 59 and the stage 3 can be reduced. Accordingly, in moving the stage 3 only in the X direction by the first ultrasonic actuator 4A, the stage 3 can be prevented from rotating with the driver elements 59 of the second ultrasonic actuator 4B being centered and also friction loss between the stage 3 and each of the driver elements 59 can be reduced.

The above-described movements of the first and second ultrasonic actuators 4A and 4B can be used not only when the stage 3 is desired to be driven merely in the X direction toward a desired location in the X direction but also when the stage 3 is desired to be moved in the X direction in moving the stage 3 alternately in the X direction and in the Y direction in order to move the stage 3 to a desired location in any direction between the X direction and the Y direction.

In the above description, only the case where the stage 3 is moved in the X direction has been explained. In moving the stage 3 only in the Y direction, the roles of the first ultrasonic actuator 4A and the second ultrasonic actuator 4B are reversed.

Therefore, according to the Embodiment 1, in moving the stage 3 using only one of the first and second ultrasonic actuators 4A and 4B in a moving direction corresponding to the ultrasonic actuator, the other ultrasonic actuator is made to vibrate in parallel to the lower surface of the stage 3. Thus, a friction state between each of the driver elements 59 of the other ultrasonic actuator and the stage 3 is changed to a dynamic friction state and also the sliding speed of the driver elements 59 on the stage 3 is increased to reduce a dynamic friction coefficient. Accordingly, friction force between each of the driver elements 59 and the stage 3 can be reduced and the stage 3 can be smoothly and efficiently moved by the one ultrasonic actuator.

Moreover, by forming each of the first and second ultrasonic actuators 4A and 4B into a structure where vibration of the piezoelectric element 50 in parallel to the lower surface of the stage 3 is a longitudinal direction and also providing the driver elements 59 so that the driver elements 59 are symmetrically located about a center portion of a long side surface of the piezoelectric element 50 in the longitudinal direction, as described above, the driver elements 59 can be prevented from giving unnecessary driving power to the stage 3 when only vibration in parallel to the lower surface of the stage 3 is generated in the piezoelectric element 50 to slide the driver elements 59 with respect to the stage 3.

More specifically, even with the piezoelectric element 50 in a halt state, the driver elements 59 are biased against the stage 3 by the bias rubber 72 and thus small friction force is generated between each of the driver elements 59 and the stage 3 even when the piezoelectric element 50 is vibrated only in parallel to the lower surface of the stage 3. By the way, as described above, if the piezoelectric element 50 on which the driver elements 59 are provided so as to be symmetrically located about the center portion of the long side surface in the longitudinal direction is brought into longitudinal vibration, the driver elements 59 vibrate along the longitudinal direction with the center portion in the longitudinal direction as the center so that their respective vibration directions are opposite to each other but their amplitudes are the same. That is, friction force generated when the driver elements 59 slide with respect to the stage 3 is symmetrical about the center portion of the piezoelectric element 50 in the longitudinal direction and, therefore, respective frictions of the driver elements 59 cancel each other. As a result, when the piezoelectric element 50 is vibrated in parallel to the lower surface of the stage 3, driving force can be kept from being applied from the driver elements 59 to the stage 3, and accordingly damping of movement of the stage 3 by one of the ultrasonic actuators 4A and 4B can be prevented.

Furthermore, when each of the first and second ultrasonic actuators 4A and 4B is formed so that the vibration of the piezoelectric element 50 in parallel to the lower surface of the stage 3 is longitudinal vibration, the piezoelectric element 50 is arranged between the bottom wall portion 21 of the fixed member 2 and the stage 3 so that the lateral direction of the piezoelectric element 50 is perpendicular to the lower surface of the stage 3 and the longitudinal direction of the piezoelectric element 50 is in parallel to the surface of the stage 3. Therefore, compared to the structure in which the piezoelectric element 50 is arranged so that the longitudinal direction of the piezoelectric element 50 is perpendicular to the lower surface of the stage 3, a distance between the bottom wall portion 21 and the stage 3 can be reduced, thus resulting in downsizing of the drive unit 1.

Next, specific control of an ultrasonic actuator according to Embodiment 1 will be described with reference to the accompanying drawings. In the following description, each component having substantially the same function as that in the description above is identified by the same reference numeral and therefore the description thereof will be omitted.

Figure 10:
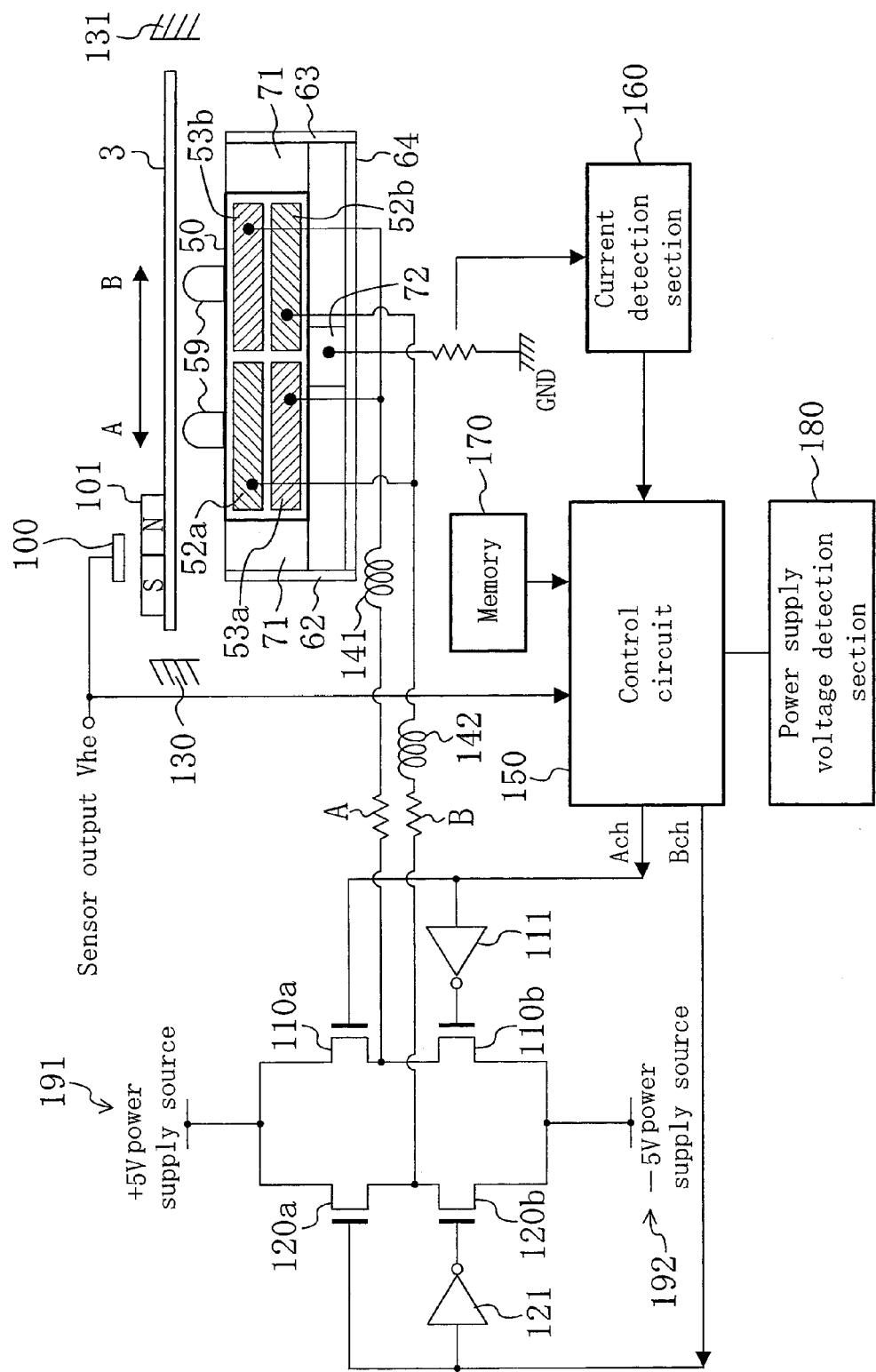
FIG. 10 is a circuit diagram illustrating a configuration of an ultrasonic actuator control circuit.

FIG. 10 is a circuit diagram illustrating a configuration of an ultrasonic actuator control circuit. As described above, the ultrasonic actuator includes a piezoelectric element 50, internal electrodes 52 and 53, driver elements 59, a first short side wall portion 62, a second short side wall portion 63, a long side wall portion 64, support rubbers 71 and a bias rubber 72. A stage 3 including ceramic reinforcing members 33 is formed as a movable member so as to be moved, as shown in FIG. 10, in an A direction and in a B direction.

As fixed members, which function in the same manner as support members (not shown), contact sections 130 and 131 (for example, the side wall sections 22) are provided, so that when the stage 3 is brought in contact with the contact section 130 or the contact section 131, the stage 3 is halted.

101 denotes a magnet attached to the stage 3 and the location of the stage 3 is detected by a location detection sensor 100 formed of a hall element.

The control circuit 150 receives an output of the location detection sensor 100. Then, the control circuit 150 controls a frequency and a phase of voltage pulse or current pulse to be applied to the piezoelectric element 50, based on location information for the stage 3, which is output from the location detection sensor 100. Signals for control of the frequency and the phase are output from an Ach and a Bch. The control circuit 150 can also perform ON/OFF control for a signal to be applied to the piezoelectric element 50.

Figure 11:
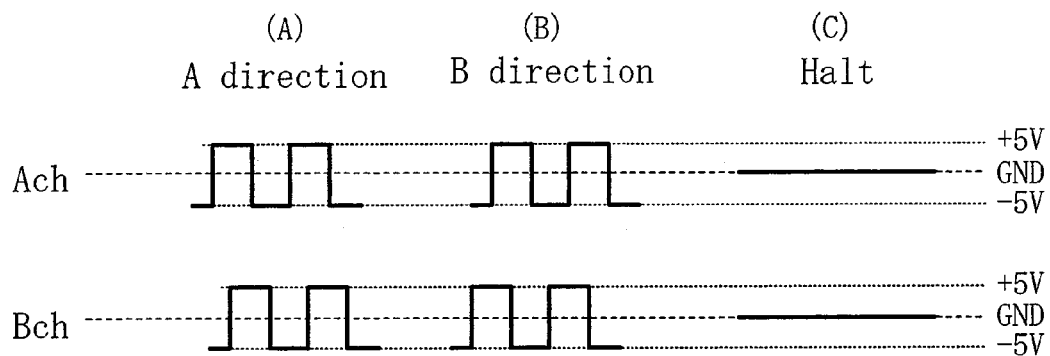
FIG. 11 is a waveform chart showing drive signals.

As shown in FIG. 11A, in moving the stage 3 in the A direction, rectangular wave pulses are output from the Ach and the Bch, so that a phase difference between the Ach and the Bch is in a state where the phase of the Bch is delayed from the phase of the Ach by 90°. As shown in FIG. 11B, in moving the stage 3 in the B direction, rectangular wave pulses are output from the Ach and the Bch, so that a phase difference between the Ach and the Bch is in a state where the phase of the Bch is forwarded from the phase of the Ach by 90°. As shown in FIG. 11C, in halting the stage 3, signals from the Ach and the Bch are made to be at a GND level.

110a, 110b, 120a and 120b denote switching devices, such as power FETs.

When a signal of the Ach to be input to the switching device 110a is +5 V, power is supplied to the electrodes 53a and 53b of the piezoelectric element 50 from a +5 V power supply source 191 connected to the switching device 110a via a coil 141. On the other hand, when a signal from the Ach is input to the switching device 110b via an inverter 111 (which outputs −5 V when +5 V is input thereto and outputs +5 V when −5 V is input thereto) and the signal from the Ach is +5 V, a signal input to the switching device 110b is −5 V. Accordingly, the switching device is OFF.

When a signal of the Ach to be input to the switching device 110a is −5 V, the switching device 110a is OFF. On the other hand, when a signal from the Ach is input to the switching device 110b via the inverter 111 and the signal of the Ach is −5 V, a signal input to the switching device 110b is +5 V. Accordingly, power is supplied to the electrodes 53a and 53b of the piezoelectric element 50 from a −5 V power supply source 192 connected to the switching device 110b via the coil 141.

When a signal of the Bch to be input to the switching device 120a is +5 V, power is supplied to the electrodes 52a and 52b of the piezoelectric element 50 from the +5 V power supply source 191 via a coil 142. On the other hand, when a signal from the Bch is input to the switching device 120b via an inverter 121 (which outputs −5 V when +5 V is input thereto and outputs +5 V when −5 V is input thereto) and the signal of the Bch is +5 V, a signal input to the switching device 120b is −5 V. Accordingly, the switching device 120b is OFF.

When a signal of the Bch to be input to the switching device 120a is −5 V, the switching device 120a is OFF. On the other hand, when a signal from the Bch is input to the switching device 120b via the inverter 121 and the signal of the Bch is −5 V, a signal input to the switching device 120b is +5 V. Accordingly, power is supplied to the second electrodes 52a and 52b of the piezoelectric element 50 from a −5 V power supply source 192 connected to the switching device 120b via the coil 142.

As in this embodiment, when a signal output from each FET is a rectangular wave signal, the signal includes not only the first-order frequency component but also a plurality of higher-order frequency components. Among signals to be applied to the piezoelectric element 50, harmonic frequency components such as the third-order frequency component and the fifth-order frequency component might cause a drop of driving efficiency and damage of a piezoelectric element itself. To cope with this, the coils 141 and 142 are provided, so that the first-order frequency components from frequency components of the rectangular wave are mainly applied to the piezoelectric element 50. When a signal output from each FET is a sine wave signal, the coils may be inserted or do not have to be inserted.

The control circuit 150 is connected to a current detection section 160 for reading a voltage value of a current detection resistance provided in a ground electrode GND and thereby detecting a current fed to the piezoelectric element and a memory 170 for storing data. Functions of the current detection section 160 and the memory 170 will be described later.

With the above-described configuration, the stage 3 is moved by supplying power to the piezoelectric element 50 to induce vibration of the driver elements 59 in the direction in which the stage 3 is to be moved and, based on an output of the location detection sensor 100, the control circuit 150 controls a power waveform to be applied to the piezoelectric element 50. Thus, the movement of the stage 3 can be controlled.

Figure 12:
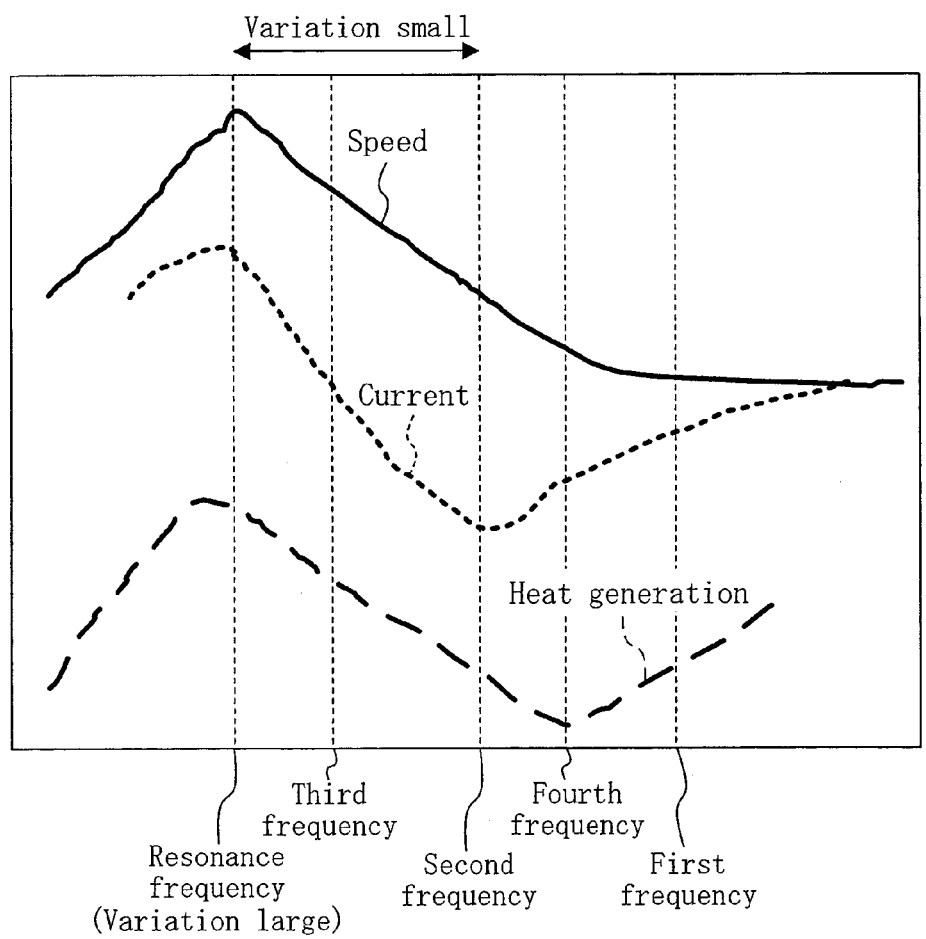
FIG. 12 is a conceptual diagram showing respective frequency characteristics of speed, a current and heat generation of an actuator according to Embodiment 1 with respect to a drive voltage.

FIG. 12 is a conceptual diagram showing respective frequency characteristics of speed, a current and heat generation of an actuator. In FIG. 12, the abscissa indicates frequency, a solid line indicates speed characteristic, and a dash line indicates heat characteristic. Each characteristic curb indicates a conceptual behavior and an absolute value on the ordinate is not particularly significant.

Theoretically, when a constant voltage driving is performed, a current value becomes maximum at a frequency corresponding to a resonance frequency at which an impedance is the lowest for an actuator and becomes minimum at an antiresonance frequency at which the impedance is the highest for an actuator. As understood from FIG. 12, an actual current frequency characteristic becomes maximum around a resonance frequency and becomes minimum at a frequency lower than the antiresonance frequency. A speed corresponding to an output becomes maximum at a resonance frequency and is reduced as the frequency becomes higher. Thus, for a driving frequency, a best output efficiency range with respect to power is from a resonance frequency to an antiresonance frequency.

However, it is known that due to variation in processing accuracy for the piezoelectric element, variation in material constant of the piezoelectric element, variation in contraction percentage of a material and the like, the absolute value of resonance frequency has variation of about 10 kHz at most. Therefore, it is difficult to set a driving frequency based on only a resonance frequency (theoretical value). To cope with this, a resonance frequency of an actuator after assembling may be actually measured, but it is difficult to measure the resonance frequency after assembling because a large amount of current flows at around the resonance frequency to increase a calorific value. For this reason, it is not possible to use the resonance frequency itself as a reference frequency for setting a driving frequency.

In contrast, variation in frequency band between the resonance frequency and the antiresonance frequency is about 1 kHz even if material constant variation and fabrication variation exist. Moreover, since the antiresonance frequency can be considered as a frequency at which a current value becomes substantially minimum, a current value can be measured and this allows measurement of the antiresonance frequency after assembling. According to this embodiment, a frequency at which a current value becomes minimum after assembling is determined to be a reference frequency and a setting range for a driving frequency is determined based on the reference frequency. Then, control is performed to set a driving frequency according to the determined setting range.

Figure 13:
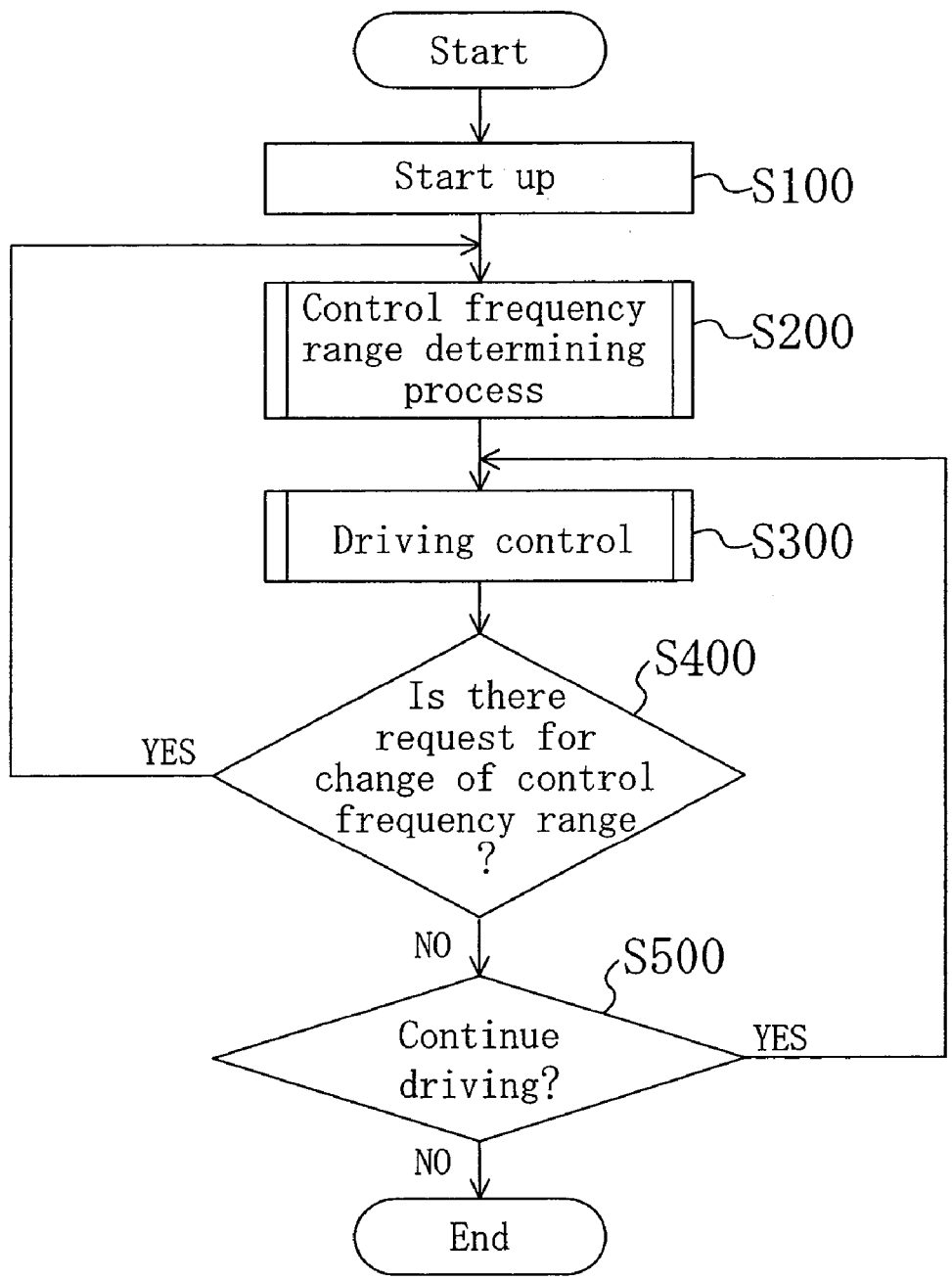
FIG. 13 is a flow chart illustrating control flow according to Embodiment 1.

FIG. 13 is a flow chart illustrating control flow according to Embodiment 1. In FIG. 13, when the actuator is started up (S100), the process shifts to a control frequency range determining process step (S200). In the control frequency range determining process step (S200), a control frequency range (corresponding to a control range) is determined by a method which will be described later, and the process shifts to driving control (S300). Next, whether there is a request for change of the control frequency range is checked (S400). If there is a request (Yes), the process returns to S200 and, if there is no request (No), the process proceeds to driving continuation confirmation (S500). In the driving continuation confirmation process step, if driving is to be continued (Yes), the process returns to S300, if not (No), the process is ended.

Herein, a request for change of the control frequency range is an instruction to redetermine the control frequency range. Whether there is the frequency range change request is judged according to whether or not a signal corresponding to a request for change is externally input to the control circuit 150. The signal corresponding to this request can be manually input by a user via input means such as an operation switch and the like in order to redetermine the control frequency range at a time of shipping or when an ambient temperature is changed.

Figure 14:
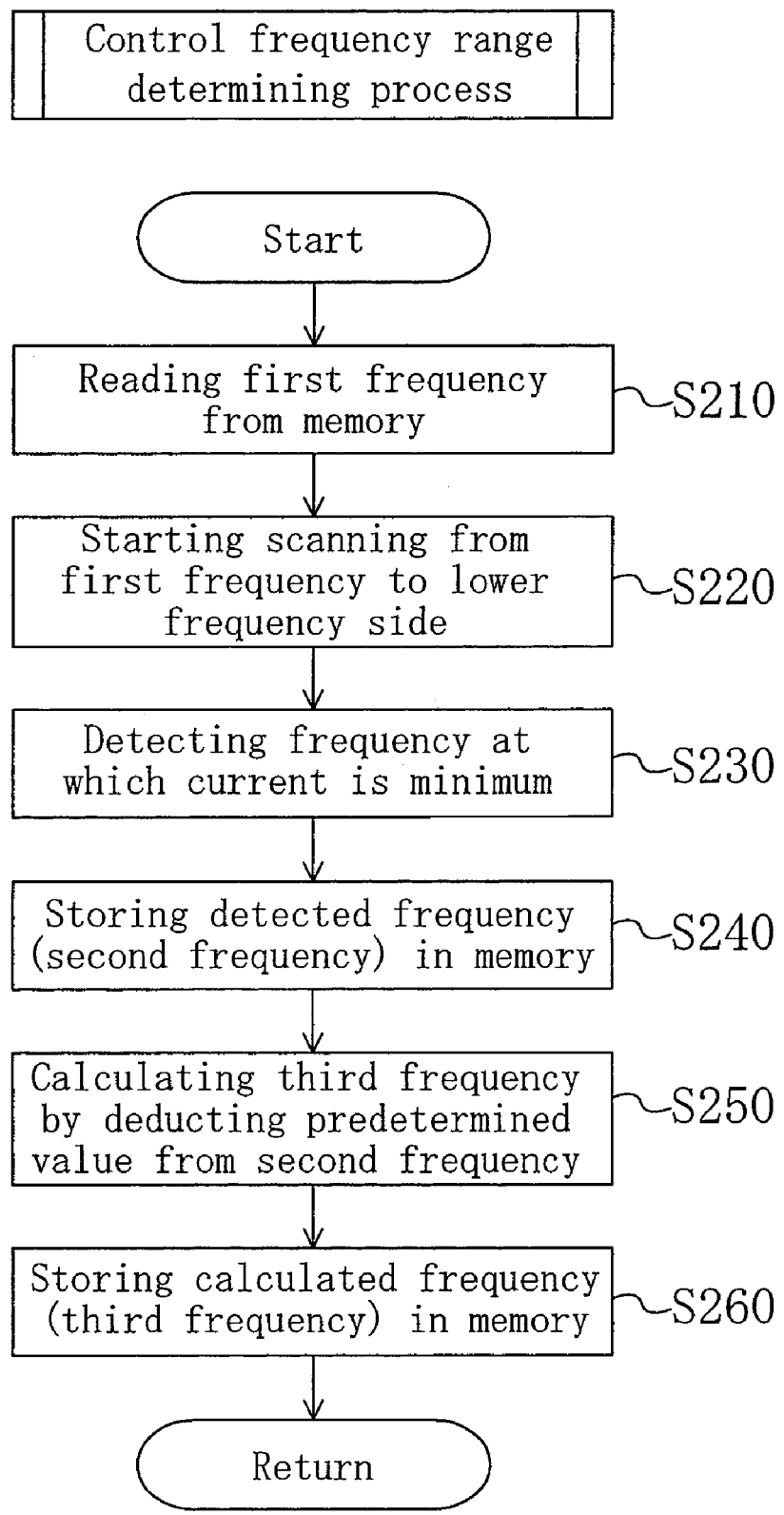
FIG. 14 is a flow chart illustrating steps for control frequency determining process according to Embodiment 1.

FIG. 14 is a flow chart illustrating steps for control frequency determining process. In FIG. 14, first, a value of a first frequency stored in the memory in advance is read from the memory (S210). This first frequency is a higher frequency value than the antiresonance frequency.

Next, the frequency of a driving signal (driving voltage) is determined to be the first frequency and the driving signal is applied to the piezoelectric element 50. Then, a current fed to the piezoelectric element 50 at that time is measured via the current detection section 160. A current fed to the piezoelectric element 50 is measured while the frequency of the driving signal is changed from the first frequency to a lower frequency side, thereby searching a frequency at which a current value is at a local minimum value (S220). Then, a frequency at which a local minimum current value is obtained is detected (S230) and a detected frequency is stored as a second frequency (corresponding to a reference frequency) in the memory (S240).

Frequencies indicating local minimum and maximum current values, respectively, are dependent on the value of a voltage applied to the piezoelectric element. Therefore, a voltage value of the driving signal when a local minimum current value is searched is determined to be a voltage value used when an actuator is actually driven. Thus, a frequency at which a current value is local minimum is obtained and which meets a voltage value when the actuator is actually driven.

The voltage value when the actuator is actually driven is preferably high so that the actuator is driven at high speed at a lower limit of the frequency control range which has been determined. However, if the driving signal having such a high voltage value and a frequency at which the current value becomes local maximum is applied, the piezoelectric element might be damaged. Therefore, when measuring the local minimum value, it is preferable to measure a current value while changing the frequency of the driving signal with such a high voltage value so that the frequency is set not to be a frequency at which the current becomes local maximum. For this purpose, scanning of the frequency of the driving signal is performed from the first frequency presumed to be higher than the antiresonance frequency to the lower frequency side.

Next, a frequency obtained by deducting a predetermined value (corresponding to a predetermined deduction value) from the second frequency stored in the memory is stored as a third frequency in the memory (S250), and then the process returns to a main flow.

Based on a difference between the antiresonance frequency and the resonance frequency which has been measured or calculated in advance, the predetermined value used in calculating the third frequency is determined to be a value equal to or smaller than the difference. The difference between the antiresonance frequency and the resonance frequency is called resonance band and determined by an element material constant and an electrode shape. The resonance band is larger as the electromechanical coupling coefficient K31 of a piezoelectric material and the electrode shape are larger and accounts for several percent of the resonance frequency (e.g., when the resonance frequency is 300 kHz, the resonance band is about 10 kHz) with the same material and the same electrode design. A frequency variation in this resonance band is 1 kHz or less and is very small, compared to variation in the resonance frequency itself. Therefore, the third frequency obtained by deducting a predetermined value which has been determined based on the difference between the antiresonance frequency and the resonance frequency from the second frequency at which the current value becomes local minimum is hardly affected by variation due to differences between individual devices and is approximately equal to or higher than the resonance frequency. Note that to reliably determine the third frequency at a higher frequency than the resonance frequency, the predetermined value is determined so that the lower limit of the control frequency range is higher than a frequency at which the current value becomes local maximum, i.e., the third frequency is higher than a frequency at which the current value becomes local maximum. For example, the predetermined value may be determined to be smaller than the difference between the antiresonance frequency and the resonance frequency so that the third frequency is not equal to or lower than the resonance frequency even if there is an influence of variation due to differences between individual devices and the like. Note that according to this embodiment, the predetermined value used in calculating the third frequency is derived from the electromechanical coupling coefficient and accounts for about 1% to 5% of the resonance frequency.

In the following driving process, a driving frequency is set to be a frequency in the range equal to or higher than the third frequency stored in the memory. Specifically, based on location information obtained from a location detection section, frequency control is performed to set the driving frequency to be equal to or higher than the third frequency so that desired characteristics are achieved. Thus, the driving frequency is set to be a frequency in the range equal to or higher than the third frequency, so that appropriate driving power is ensured and a larger output control range can be achieved. Moreover, adjustment according to changes depending on temperature characteristics and surroundings can be performed by determining the third frequency at each start-up. Note that the actuator is equipped in the drive unit 1, a camera or like other systems and used. In such case, when a system (for example, a camera and the like) equipped with the actuator is started, the actuator is also started. Therefore, determining of the control frequency range is performed at a start up of the system.

When it is desired to perform control at very low speed and thus the frequency is very high, a current starts increasing to reduce efficiency and heat is generated in the piezoelectric element. In such case, control may be performed using a frequency equal to or lower than the second frequency. When control is performed using the second frequency and it is still desired to reduce the speed furthermore, still using the frequency, a phase difference between the first power supply source and the second power supply source may be controlled or the on duty of a pulse may be controlled to reduce the speed. Note that even when the phase difference or on duty is controlled using only the second frequency, the range of controllable speed is very narrow and thus is not very practical.

Furthermore, a specific numeric example will be described. An ultrasonic actuator having dimensions of 6 mm×1.7 mm×2.5 mm was used. The ultrasonic actuator includes 25 layers each having an effective thickness of 100 μm. A power source voltage Vdd was 5 V. For a setting at a time of shipping, a frequency of 290 kHz as a first frequency and a frequency band of 4 kHz as a predetermined value (deduction value) were stored in a memory device. With this setting, the actuator was started up and while scanning of frequencies of driving signals was performed from the first frequency to the lower frequency side at a speed of 0.1 kHz/1 ms, voltage values in a G section as a current detection section were measured for the scanned frequencies, respectively, at 1 ms intervals. A corresponding current to each of the voltage values, which were obtained by averaging measured values from five measurements for each of the scanned frequencies, was stored in a storage section. The current was compared to a minimum current stored in advance. If the current was smaller than the minimum current stored in advance, the minimum current and a corresponding frequency thereto were updated. When the update of the minimum current was no longer performed, scanning of frequencies was further performed toward the lower frequency side only by the frequency band of the predetermined value (deduction value). Then, if still no further update of the minimum current was performed during the scanning, the updated corresponding frequency was determined to be the second frequency and a frequency smaller than the corresponding frequency by the frequency band was determined to be the third frequency. In this numeral value setting, if a current value of the third frequency is larger than a specific current value, scanning is started all over again from the first frequency. If the current value of the third frequency is still larger than a specific current value even after specific times of scanning, the frequency band which has been determined in advance, i.e., the predetermined value (deduction value) is reduced and then scanning is performed again.

The numerical values determined in the above-described manner were as follows. The second frequency was 280 kHz, the current value was 50 mA, and the speed of a movable body was 50 nm/s. The third frequency was 276 kHz, the current value was 70 mA, and the speed of the movable body was 100 m/s. Thereafter, a control section (i.e., the control circuit 150) performed control by selecting frequency from 276 kHz to 280 kHz at 100 mm/s to 50 mm/s. The control section performed control by determining the on duty of a driver section to be 50% to 10% at a driving frequency of 280 kHz at 50 mm/s or less. In the above-described working example of numerical values, the driving power was adjusted to be an appropriate level and a large output control range was achieved.

Figure 15:
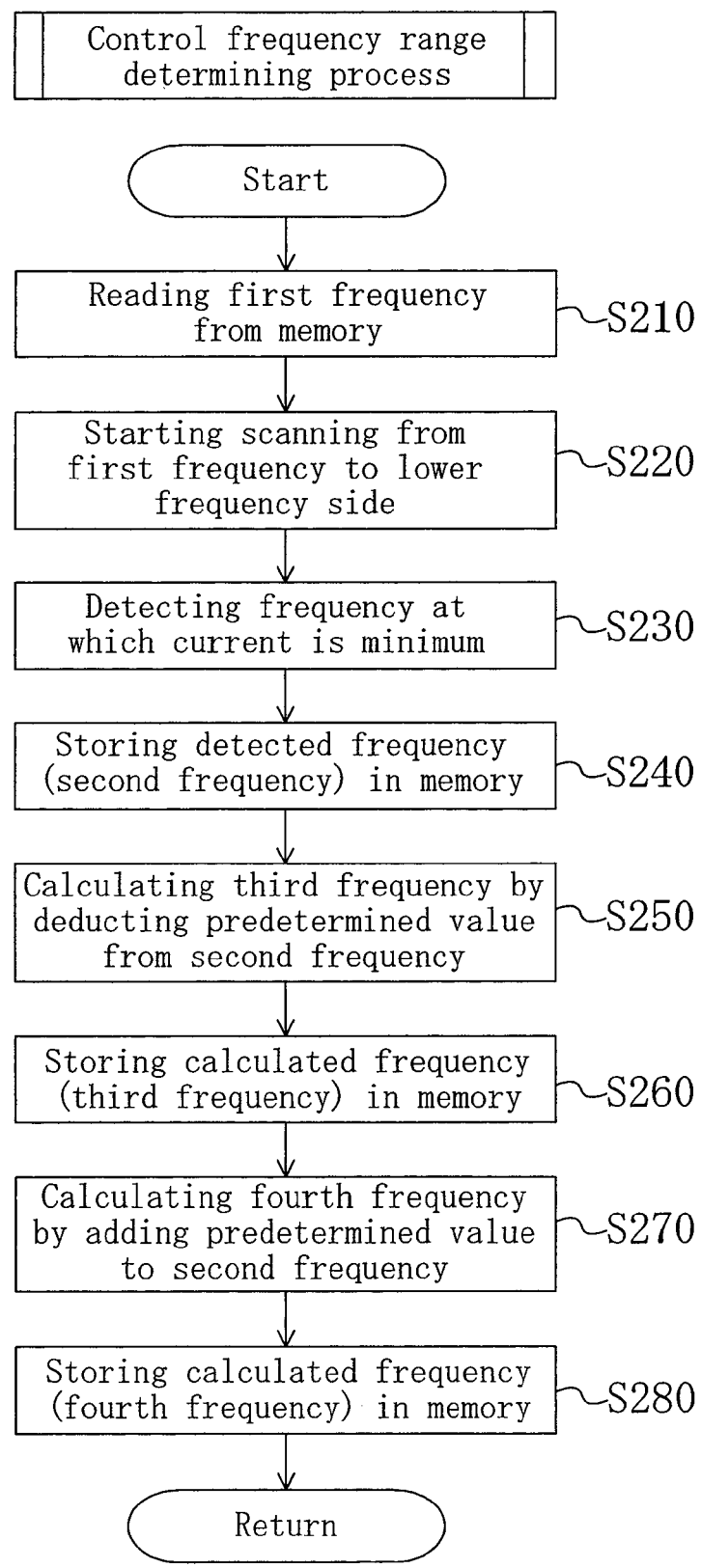
FIG. 15 is a flow chart illustrating another set of steps for control frequency determining process according to Embodiment 1.

FIG. 15 is a flow chart illustrating another set of steps for control frequency determining process. In FIG. 15, following S260, the frequency is obtained by adding a predetermined value (corresponding to a predetermined adding value) which has been determined in advance from the second frequency stored in the memory (S260) and then is stored as a fourth frequency in the memory (S270). After that, the process returns to the main flow. Note that because the predetermined value used in calculating the fourth frequency is derived from the electromechanical coupling coefficient of a piezoelectric material, the predetermined value is preferably about 1% to 5% of the resonance frequency. The predetermined value may be the same as or different from the predetermined value used in calculating the third frequency, which has been described above.

In the following driving process, a driving frequency is set to be a frequency in a range from a frequency equal to or higher than the third frequency stored in the memory to a frequency lower than the fourth frequency stored in the memory. Specifically, based on the location information obtained from the location detection section, frequency control is performed to set the driving frequency to be equal to or higher than the third frequency so that desired characteristics are achieved. Thus, the driving frequency is set to be a frequency in the range from a frequency equal to or higher than the third frequency to a frequency lower than the fourth frequency, so that excessive increase in current value can be further suppressed and a larger output control range can be achieved especially in low speed driving.

Figure 16:
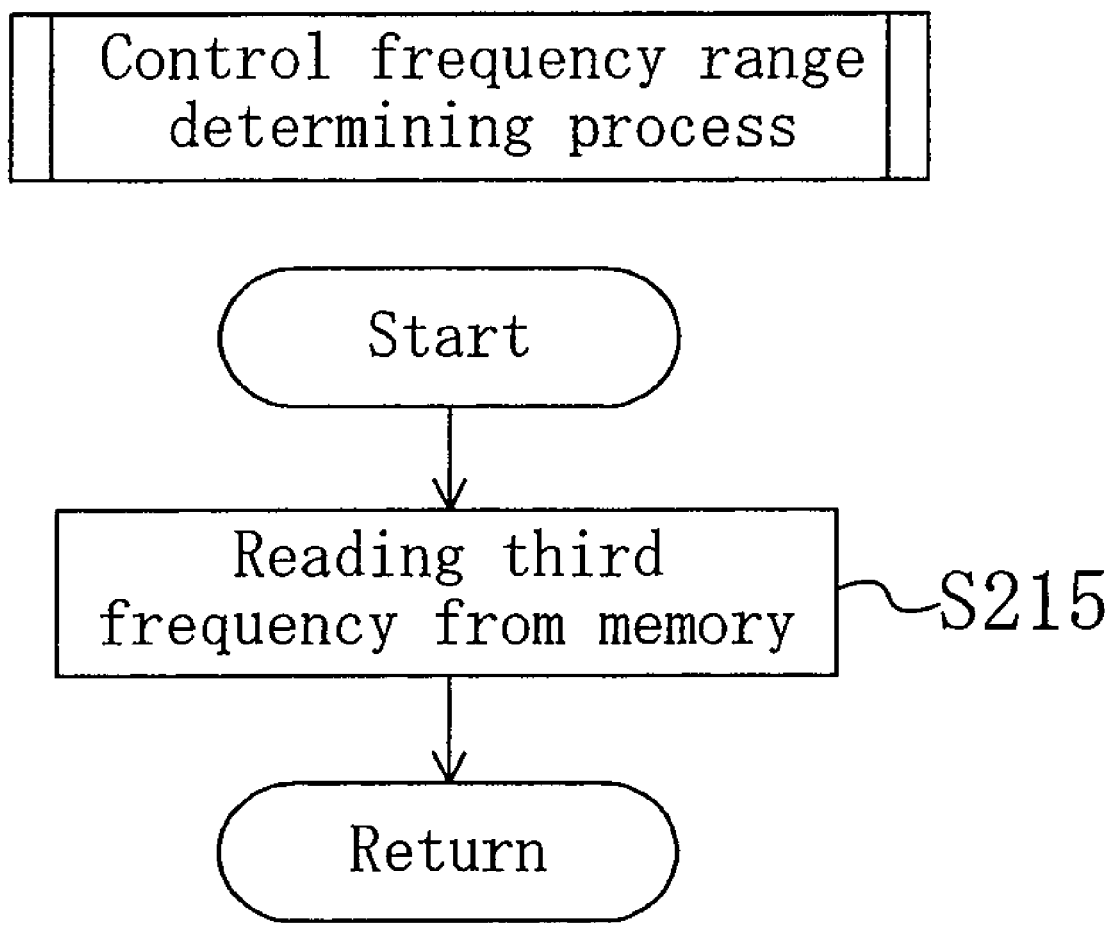
FIG. 16 is a flow chart illustrating still another set of steps for control frequency determining process according to Embodiment 1.

FIG. 16 is a flow chart illustrating still another set of steps for control frequency determining process. In FIG. 16, the third frequency, which has been described above, is stored in the memory in advance and the value thereof is read (S215). The third frequency is measured in the same manner as described above. That is, the third frequency may be obtained from a frequency corresponding to a current value detected while scanning from the first frequency. In this example, the third frequency is determined in advance, so that control can be performed in a simpler manner.

In the flow chart of FIG. 16, the third frequency is stored in the memory in advance. However, determining of the control frequency range may be performed in such a manner that the second frequency is actually measured, the second frequency and/or the fourth frequency calculated from the second frequency is stored in the memory in advance and then the control frequency range is determined based on the values thereof. That is, determining of the frequency control range may be performed in such a manner that at least one of the second frequency, the third frequency and the fourth frequency is stored in the memory and then the control frequency range is determined based on the stored frequency.

In the main flow, determining of the control frequency range is performed at a start up or when a request for change is made. However, determining of the control frequency range is not limited to such timings but may be performed at some other timing. For example, determining of the control frequency range may be performed in such a manner that the control circuit 150 monitors a current value based on a detection result of the current detection section 160 and the control frequency range is determined when the current value exceeds a predetermined threshold. Thus, increase in amount of calorific value in the piezoelectric element 50 can be prevented. Moreover, as shown in FIG. 10, a power supply voltage detection section 180 for detecting power supply voltages of the power supply sources 191 and 192 connected to the switching devices 110*a*, 110*b*, 120*a* and 120*b* is provided so that an output result of the power supply voltage detection section 180 is input to the control circuit 150. The control circuit 150 may be formed so as to judge whether or not the power supply voltages have been changed (i.e., dropped) based on the detection result of the power supply voltage detection section 180 and perform determining of the control frequency range when change of the power supply voltages is detected.

The current detection section detects a current value by reading a voltage value of a current detection resistance provided in a ground electrode of the piezoelectric element. Thus, by using the current detection resistance, current detection can be performed in an inexpensive manner. However, current detection may be performed by referring to some other part. For example, a location where a current is detected may be an A section or a B section. Also, the current may be the sum of currents of the A and B sections, a value obtained by deducting a current of the G section from the sum of currents of the A and B sections, or the like. Herein, the A section is a resistance connected to the coil 141 in series and the B section is a resistance connected to the coil 142 in series. The current detection section may be a current trans. In such case, there is no voltage drop due to a resistance and thus deterioration of efficiency can be prevented.

Also, start up means herein not only a time when power is turned ON but also a time when a protective circuit, which is operated when a current equal to or larger than a predetermined value flows therein, is operated, a time when an instruction of ACT is turned ON and the like. The frequency band corresponding to a predetermined value has been already determined at a time of shipping. However, when a current value of a measured current exceeds a reference value, the frequency band is narrowed so that highly reliable driving can be performed.

As has been described, according to Embodiment 1, appropriate driving power can be ensured and an ultrasonic actuator having a wide output control range can be provided.

In other words, an ultrasonic actuator according to Embodiment 1 includes an actuator body which has a piezoelectric element and performs bending vibration and longitudinal vibration, a driver element which is attached to a side surface of the actuator facing the vibration direction of the bending vibration, makes an orbit motion in a plane including a vibration direction of the bending vibration and a vibration direction of the longitudinal vibration according to vibration of the actuator body and thereby outputs driving force, a power supply section for applying to the actuator body first and second driving voltages having the same driving frequency and different phases from each other, a control section for setting, in the power supply section, the driving frequency to be applied, and a memory section for storing data related to a reference frequency at which a current value of a current fed to the piezoelectric element is local minimum. The control section determines a setting range of the driving frequency, based on the data related to the reference frequency stored in the memory section, and sets the driving frequency to be a frequency in the determined setting range.

It is preferable that the ultrasonic actuator further includes a current detection section for detecting a current value of a current fed to the piezoelectric element using the first or second driving voltage, the memory section stores as the data related to the reference frequency a first frequency which is always higher than the reference frequency, and the control section obtains, in determining the setting range of the driving frequency, a second frequency at which a current value detected by the current detection section is local minimum while gradually reducing the driving frequency from the first frequency, determines the second frequency as a reference frequency, calculates a third frequency which is lower than the second frequency by a first predetermined value, and sets the driving frequency so that the driving frequency is equal to or higher than the third frequency.

It is more preferable that the ultrasonic actuator further includes a current detection section for detecting a current value of a current fed to the piezoelectric element using the first or second driving voltage, the memory section at least stores as the data related to the reference frequency a first frequency which is always higher than the reference frequency, and the control section obtains, in determining the setting range of the driving frequency, a second frequency at which a current value detected by the current detection section is local minimum while gradually reducing the driving frequency from the first frequency, determines the second frequency as a reference frequency, calculates a third frequency which is lower than the second frequency by a first predetermined value and a fourth frequency which is higher than the second frequency by a second predetermined value, and sets the driving frequency so that the driving frequency is equal to or higher than the third frequency and equal to or lower than the fourth frequency.

The control section performs control to determine the setting range of the driving frequency at each predetermined timing.

Furthermore, the predetermined timing is a time of a start up.

As an alternative, the predetermined timing is a time when a current value exceeds a predetermined threshold.

As another alternative, the predetermined timing is a time when a specific signal is received by the control section.

As still another alternative, the predetermined timing is a time when the voltage is changed.

The memory section stores, as the data related to the reference frequency, at least one of the reference frequency itself which has been detected in advance, a frequency which is a lower limit of a range including the reference frequency and a frequency which is a higher limit of the range including the reference frequency, and the control section performs control to determine the setting range of the driving frequency based on the data related to the reference frequency.

The actuator body performs first vibration of longitudinal vibration and second vibration of bending vibration.

Embodiment 2

Next, Embodiment 2 of the present invention will be described. Embodiment 2 is different from Embodiment 1 in the point that a drive unit 201 includes an ultrasonic actuator having a different structure from the structure of the ultrasonic actuator of Embodiment 1. Hereinafter, each member having the same structure as the structure described in Embodiment 1 is identified by the same reference numeral and therefore the description thereof will be omitted.

Figure 17:
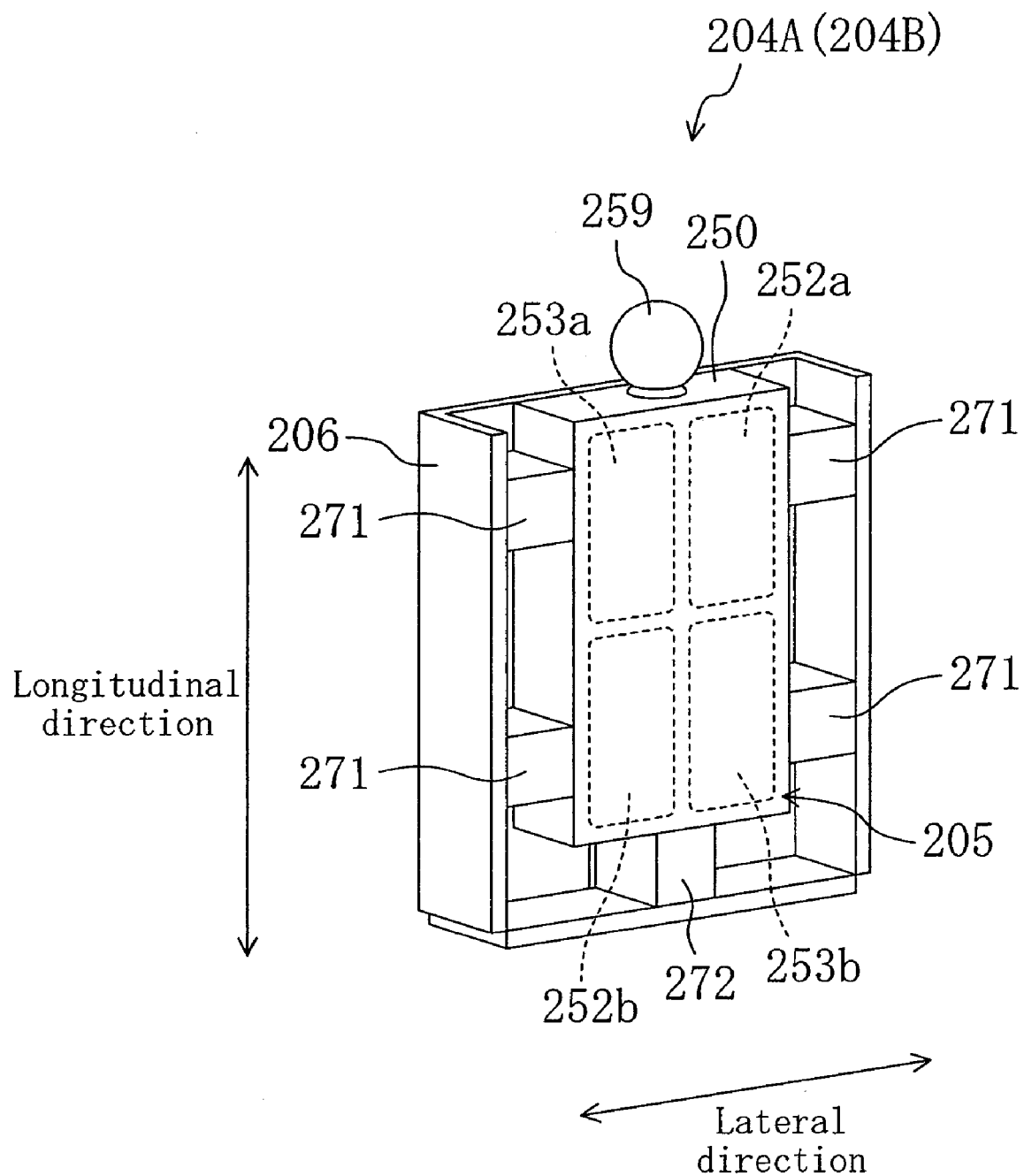
FIG. 17 is a perspective view of an ultrasonic actuator according to Embodiment 2.

As shown in FIG. 17, an actuator body 205 according to Embodiment 2 is provided with a single driver element 259 on one of short side surfaces of a piezoelectric element 250. The actuator body 205 is placed in a case 206 so that a bias rubber 272 is in contact with the other one of the short side surfaces of the piezoelectric element 250. In this state, the driver element 259 sticks out from the case 206. Each of long side surfaces of the piezoelectric element 250 has two support rubbers 271 so that the two support rubbers 271 are located between an associated one of the long side surfaces and the case 206.

Suppose that a principal surface of the piezoelectric element 250 is divided in four areas, i.e., two areas in the longitudinal direction and two areas in the lateral direction. In the piezoelectric element 250, first electrodes 252a and 252b and second electrodes 253a and 253b are provided in the same manner as in the piezoelectric element 50 of Embodiment 1.

The first electrodes 252a and 252b and the second electrodes 253a and 253b may be configured so that power is separately supplied to each of the electrodes, or so that power is supplied for each pair of electrodes located in a diagonal direction of the principal surface at time in the same manner as in Embodiment 1.

As shown in FIG. 8, longitudinal vibration and bending vibration are induced in cooperated manner in the piezoelectric element 250 by applying alternating voltages having phases shifted from each other by 90° to two pairs of electrodes each being located in an associated one of diagonal directions of the piezoelectric element 250, i.e., a pair of the first electrodes 252a and 252b and a pair of the second electrodes 253a and 253b, respectively. As a result, the driver element 259 makes an elliptical motion in a plane parallel to the principal surface of the piezoelectric element 250.

Each of first and second ultrasonic actuators 204A and 204B each having the above-described structure is arranged between a bottom wall portion 21 of a fixed member 2 and a lower surface of a stage 3 so that the driver element 259 is in contact with the lower surface of the stage 3 (specifically, a reinforcing member 33) and a longitudinal direction of the piezoelectric element 250 is in a normal direction of the lower surface of the stage 3. In other words, each of the first and second ultrasonic actuators 204A and 204B is arranged so that a direction of longitudinal vibration of the piezoelectric element 250 is perpendicular to the lower surface of the stage 3 and a direction of bending direction of the piezoelectric element 250 is in parallel to the lower surface of the stage 3.

In this structure, the first ultrasonic actuator 204A is arranged so that a lateral direction of the piezoelectric element 250 is in the X direction and the second ultrasonic actuator 204B is arranged so that a lateral direction of the piezoelectric element 250 is in the Y direction.

As has been described above, in this state, composite vibration of longitudinal vibration and bending vibration is generated in the actuator body 205 of each ultrasonic actuator 204A (204B), thereby driving the stage 3.

As in Embodiment 1, respective moving distances of the stage 3 by the first ultrasonic actuator 204A and the second ultrasonic actuator 204B are adjusted to combine respective movements of the stage 3 in the X direction and in the Y direction, so that the stage 3 can be moved in any direction in a plane parallel to the lower surface of the stage 3.

In moving the stage 3 in only one of the X direction and the Y direction, i.e., for example, only in the X direction, the first ultrasonic actuator 204A causes the piezoelectric element 250 generate composite vibration of longitudinal vibration and bending vibration to apply driving force to the stage 3, while the second ultrasonic actuator 204B causes the piezoelectric element 250 to generate vibration substantially only in a plane parallel to the lower surface of the stage 3, thereby sliding the driver element 259 with respect to the stage 3. Specifically, the second ultrasonic actuator 204B generates substantially only bending vibration of FIG. 7 in the piezoelectric element 250. By applying an alternating voltage only to one of the pairs of electrodes, i.e., the first electrodes 252a and 252b or the second electrodes 253a and the 253b, or applying alternating voltages having phases shifted from each other by 180° to the first electrodes 252a and 252b and the second electrodes 253a and the 253b, respectively, substantially only bending vibration can be generated in the piezoelectric element 250. In this case, the driver element 259 vibrates in a plane parallel to the lower surface of the stage 3 without increasing bias force against the stage 3. As a result, the driver element 259 slides with respect to the stage 3.

Therefore, according to Embodiment 2, as in Embodiment 1, in moving the stage 3 by only one of the first and second ultrasonic actuators 204A and 204B in a moving direction in accordance with the ultrasonic actuator, the other one of the first and second ultrasonic actuators 204A and 204B is vibrated in parallel to the lower surface of the stage 3, i.e., only bending vibration of the other ultrasonic actuator is induced. Thus, a friction state between the driver element 259 of the other ultrasonic actuator and the stage 3 is made to be a dynamic friction state. Also, the sliding speed of the driver element 259 on the stage 3 is increased and the dynamic friction coefficient is reduced, so that friction force between the driver element 259 and the stage 3 can be reduced. Accordingly, the stage 3 can be smoothly and efficiently moved by the one ultrasonic actuator.

Embodiment 3

Subsequently, Embodiment 3 of the present invention will be described. Embodiment 3 is different from Embodiment 1 in the point that a drive unit includes an ultrasonic actuator having a different structure from the structure of the ultrasonic actuator of Embodiment 1. Hereinafter, each member having the same structure as the structure described in Embodiment 1 is identified by the same reference numeral and therefore the description thereof will be omitted.

Figure 18:
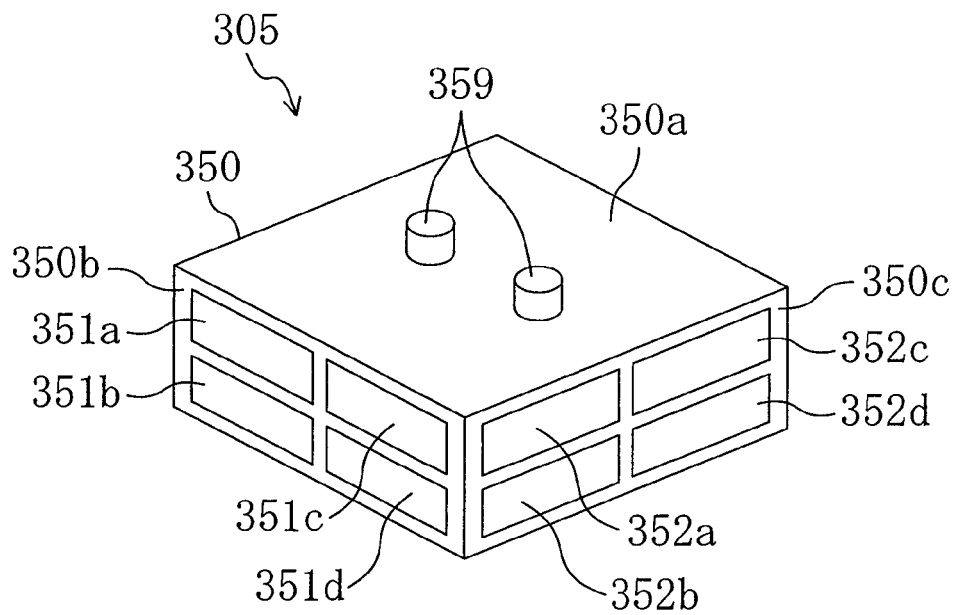
FIG. 18 is a perspective view of an actuator body according to Embodiment 3.
Figure 19:
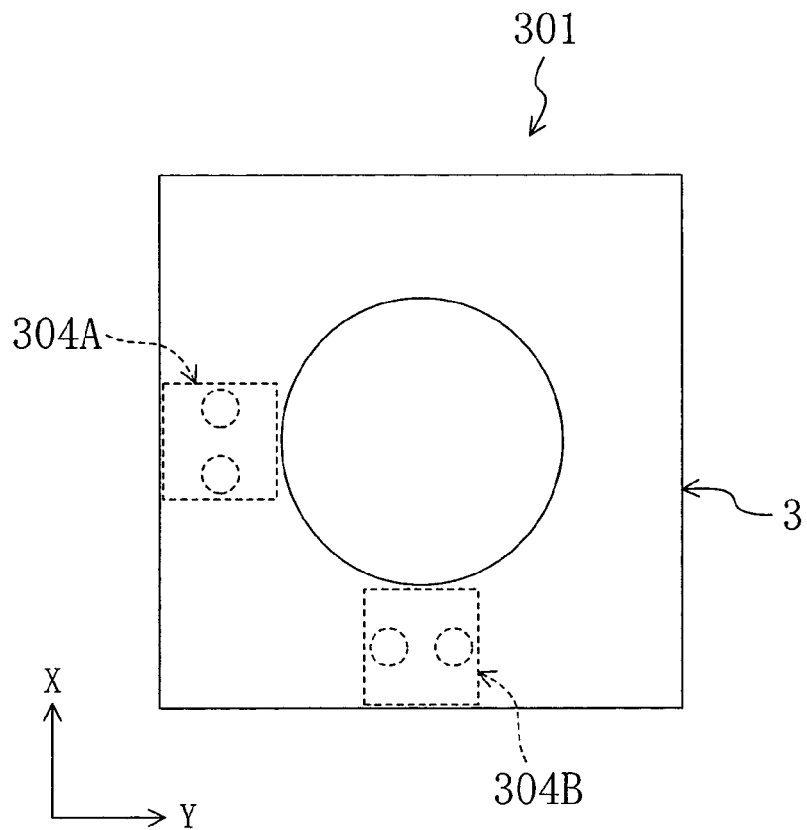
FIG. 19 is a schematic plan view illustrating an arrangement of an ultrasonic actuator.

Each of first and second ultrasonic actuators 304A and 304B according to Embodiment 3 includes an actuator body 305 of FIG. 18, a case (not shown) for housing the actuator body 305, support rubbers (not shown) for elastically supporting the actuator body 305 in the case, and a bias rubber (not shown) for biasing the actuator body 305 against the stage 3.

As shown in FIG. 18, the actuator body 305 includes a metal body part 350, a plurality of piezoelectric elements 351a, 351b . . . , and driving elements 359 provided on the body part 350.

The body part 350 includes an upper surface 350a and a lower surface (not shown) each having an approximately square shape and four side surfaces 350b and 350c (only two are shown in FIG. 18) each having an approximately rectangular shape. Each of the side surfaces is arranged so that both of long side portions thereof are in touch with an associated one of side portions of the upper surface 350a and an associated one of side portions of the lower surface, i.e., a lateral direction of each of the side surfaces is in the vertical direction.

Two driving elements 359 are provided on the upper surface 350a of the body part 350. The two driving elements 359 are arranged so as to align in a line passing through the barycenter of the upper surface 350a and extending in parallel to a pair of side portions of the upper surface 350a.

Four piezoelectric elements 351a, 351b, 351c and 351d and four piezoelectric elements 352a, 352b, 352c and 352d are attached, respectively, onto two side surfaces of 350b and 350c of the body part 350 which are adjacent to each other. The piezoelectric elements 351a, 351b, 351c and 351d are respectively arranged in four areas, i.e., two areas in the longitudinal direction and two areas in the lateral direction of the side surface 350b. In the same manner, piezoelectric elements 352a, 352b, 352c and 352d are respectively arranged in four areas, i.e., two areas in the longitudinal direction and two areas in the lateral direction of the side surface 350c. Unlike Embodiments 1 and 2, the piezoelectric elements 351a, 351b, 351c and 351d and the piezoelectric elements 352a, 352b, 352c and 352d are formed so that a single electrode is provided in each piezoelectric element. Accordingly, an entire piezoelectric element uniformly expands and contracts by supplying power to the entire piezoelectric elements at a time.

In the actuator body 305 having the above-described structure, on the side surface 350*b*, alternating voltages having phases shifted from each other by 90° are respectively applied to the pair of piezoelectric elements 351*a* and 351*d* diagonally located and the other pair of piezoelectric elements 351*b* and 351*c* diagonally located, thereby generating longitudinal vibration along a longitudinal direction of the side surface 350*b* and bending vibration along a lateral direction of the side surface 350*b* in a cooperated manner in the body part 350. As a result, each of the driving elements 359 makes an approximately elliptical motion in a plane parallel to the side surface 350*b*. Also, in the actuator body 305, on the side surface 350*c*, alternating voltages having phases shifted from each other by 90° are applied to the pair of piezoelectric elements 352*a* and 352*d* diagonally located and the other pair of piezoelectric elements 352*b* and 352*c* diagonally located, respectively, thereby generating longitudinal vibration along longitudinal direction and bending vibration along a lateral direction of the side surface 350*c* in a cooperated manner in the body part 350. As a result, each of the driving elements 359 makes an approximately elliptical motion in a plane parallel to the side surface 350*c*.

As the ultrasonic actuator 4A and 4B of the Embodiment 1 shown in FIGS. 1 and 2, each of the first and second ultrasonic actuators 304A and 304B each of which includes the actuator body 305 having the above-described structure is arranged between a bottom wall portion 21 of a fixed member 2 and a lower surface of a stage 3 (specifically, a reinforcing member 33). Specifically, the first ultrasonic actuator 304A is arranged in vicinity of one side edge portion of the lower surface of the stage 3 so that the direction in which the driving elements 359 align is in parallel to the side edge portion (this direction is referred to as an X direction), i.e., the longitudinal direction of the side surface 350*b* of the piezoelectric element 350 is in parallel to the side edge portion. On the other hand, the second ultrasonic actuator 304B is arranged in vicinity of another side edge portion of the lower surface of the stage 3 which is perpendicular to the one side edge portion so that the direction in which the driving elements 359 align is in parallel to the side edge portion (this direction is referred to as a Y direction), i.e., the longitudinal direction of the side surface 350*b* of the piezoelectric element 350 is in parallel to the side edge portion.

In the drive unit 301 having the above-described structure, the first ultrasonic actuator 304A has the driving elements 359 make an approximately elliptical motion in a plane parallel to the side surface 350*b* (of which the longitudinal direction is in the X direction), basically, by driving the piezoelectric elements 351*a*, 351*b*, 351*c* and 351*d* provided on the side surface 350*b*. That is, the first ultrasonic actuator 304A is mainly used to move the stage 3 in the X direction. On the other hand, the second ultrasonic actuator 304B has the driving elements 359 to make an approximately elliptical motion in a plane parallel to the side surface 350*b* (of which the longitudinal direction is in the Y direction), basically, by driving the piezoelectric elements 351*a*, 351*b*, 351*c* and 351*d* provided on the side surface 350*b*. That is, the first ultrasonic actuator 304B is mainly used to move the stage 3 in the Y direction.

In moving the case where the stage 3 in only one of the X direction and the Y direction, for example, only in the Y direction, the second ultrasonic actuator 304B has the driving elements 359 make an approximately elliptical motion in a plane parallel to the side surface 350*b* of which the longitudinal direction is in the Y direction, thereby moving the stage 3 in the Y direction and, on the other hand, the first ultrasonic actuator 304A has the driving elements 359 vibrate in a plane parallel to the side surface 350*c* by driving the piezoelectric elements 352*a*, 352*b*, 352*c* and 352*d* provided on the side surface 350*c* of which the longitudinal direction is in the Y direction. At this time, in the first ultrasonic actuator 304A, alternating voltages having the same phase are applied to the four piezoelectric elements 352*a*, 352*b*, 352*c* and 352*d* on the side surface 350*c* to generate only longitudinal vibration along the longitudinal direction of the side surface 350*c* in the actuator body 305. Thus, the driving elements 359 of the first ultrasonic actuator 304A perform only longitudinal vibration in the Y direction.

Therefore, according to Embodiment 3, in moving the stage 3 only in one of the X direction and the Y direction, composite vibration of longitudinal vibration and bending vibration is generated in one of the ultrasonic actuators in which the direction of alignment of the driving elements 359 matches a moving direction of the stage 3 and, on the other hand, only longitudinal vibration is generated in the other one of the ultrasonic actuators in which the direction of alignment of the driving elements 359 does not match the moving direction of the stage 3 and, more specifically, in the direction in which the alignment direction is perpendicular to the moving direction. Thus, a friction state between each of the driving elements 359 in one of the ultrasonic actuator in which the direction of alignment of the driving elements 359 does not match the moving direction of the stage 3 and the stage 3 is made to be a dynamic friction state and the sliding speed of the driving elements 359 on the stage 3 is increased, thereby reducing the dynamic friction coefficient. This allows reduction in friction force between each of the driving elements 359 and the stage 3, so that the stage 3 can be smoothly and efficiently moved by one of the ultrasonic actuators in which the direction of alignment of the driving elements 359 matches the moving direction of the stage 3.

In this case, since the longitudinal direction of the driving elements 359 in one of the ultrasonic actuators in which the direction of alignment of the driving elements 359 does not match the moving direction of the stage 3 matches the moving direction of the stage 3, influences on the movement of stage 3 by the driving elements 359 which slide with respect to the stage 3 while making longitudinal vibration can be reduced.

In Embodiment 3, the body part 350 is formed so that the lateral direction of each side surface is in the vertical direction and the body part 350 has a vertically flat rectangular parallelepiped shape. However, the body part 350 is not limited thereto. That is, the body part 350 may be formed to have a vertically long rectangular parallelepiped shape in which the longitudinal direction of each side surface is in the vertical direction. In such case, in moving the stage 3 in only one of the X direction and the Y direction, one of the ultrasonic actuators in which the direction of alignment of the driving elements 359 does not match the moving direction of the stage 3 and, more specifically, the alignment direction is perpendicular to the stage 3 causes the body part 350 to generate only bending vibration as in Embodiment 2. Thus, the driving elements 359 can be made to slide with respect to the stage 3.

The driving elements 359 are arranged on a straight line passing through the barycenter of the upper surface 350*a* and extending parallel to a pair of side portions of the upper surface 350*a*. However, the alignment of the driving elements 359 is not limited thereto.

Other Embodiments

According to the present invention, the following structure may be adopted for the above-described embodiments.

Specifically, in each of the above-described embodiments, the stage 3 is supported by the fixed member 2. However, how to support the stage 3 is not limited thereto. More specifically, an arbitrary supporting structure may be adopted as long as the structure can make the stage 3 move in a predetermined plane.

The stage 3 is provided with the reinforcing members 33. However, a structure in which the reinforcing members 33 are not provided may be used.

The drive unit includes two ultrasonic actuators in total, i.e., the first and second ultrasonic actuators. However, the number of ultrasonic actuators is not limited to two. For example, a structure in which a third ultrasonic actuator is provided so as to be opposed to the first ultrasonic actuator and the stage 3 is moved in the X direction using two ultrasonic actuators may be adopted. Furthermore, a fourth ultrasonic actuator for moving the stage 3 in some other direction than the X direction and the Y direction may be provided.

Also, the above-described ultrasonic actuators are not limited to the above-described structure. For example, each of the ultrasonic actuators do not have to have the structure in which power is supplied to piezoelectric elements via the support rubbers and the bias rubber but may have a structure in which lead lines are connected to piezoelectric elements to supply power to the piezoelectric elements. Moreover, a structure in which a node potion of vibration of each piezoelectric element is supported by an anelastic member may be adopted. Furthermore, the actuator body is formed of a piezoelectric element. However, the actuator body may be formed of a structure in which a piezoelectric element is attached onto a substrate of metal or the like or a structure in which an oscillator is formed of metal or the like and a piezoelectric element is inserted therein. In such structure, an oscillator including a piezoelectric element constitutes an actuator body. That is, an arbitrary structure can be adopted as long as the structure is formed so as to include a piezoelectric element and is capable of generating vibration in two different vibration directions.

Note that the above-described embodiments are essentially preferable examples which are illustrative and do not limit the present invention, its applications and the scope of use of the invention.

What is claimed is:

1. An ultrasonic actuator comprising:
   an actuator body for performing vibration, the actuator body including a piezoelectric element;
   a control section for setting a driving frequency of a driving voltage to be applied to the actuator body;
   a power supply section for applying the driving voltage having the driving frequency set in the control section to the actuator body; and
   a memory section for storing data related to a difference between an antiresonance frequency and a resonance frequency of the piezoelectric element,
   wherein the control section determines, based on a reference frequency at which a current value of a current fed to the piezoelectric element is local minimum and the data related to the difference between the antiresonance frequency and the resonance frequency of the piezoelectric element and stored in the memory section, a control range of the driving frequency so that a lower limit of the control range is equal to or higher than a frequency at which the current value of the current fed to the piezoelectric element is local maximum and sets the driving frequency to a value in the control range.

2. The ultrasonic actuator of claim 1, wherein the control section measures the reference frequency at which the current value of the current fed to the piezoelectric element is local minimum and determines, based on the reference frequency and the data related to the difference between the antiresonance frequency and the resonance frequency of the piezoelectric element and stored in the memory section, the control range of the driving frequency so that a lower limit of the control range is equal to or higher than a frequency at which the current value of the current fed to the piezoelectric element is local maximum.

3. The ultrasonic actuator of claim 2, further comprising: a current detection section for detecting the current value of the current fed to the piezoelectric element,
   wherein the control section obtains, while changing the driving frequency from a first frequency which is higher than the antiresonance frequency to a lower frequency side, a second frequency at which the current value detected by the current detection section is local minimum and determines the second frequency as the reference frequency.

4. The ultrasonic actuator of claim 2, wherein the memory section stores, as the data related to the difference between the antiresonance frequency and the resonance frequency of the piezoelectric element, a predetermined deduction value which is smaller than the difference between the antiresonance frequency and the resonance frequency, and
   the control section determines a third frequency which is lower than the reference frequency by the deduction value as the lower limit of the control range.

5. The ultrasonic actuator of claim 2, wherein the control section determines the control range so that the control range includes at least the reference frequency.

6. The ultrasonic actuator of claim 5, wherein the memory section stores a predetermined adding value and the control section determines a fourth frequency which is higher than the reference frequency by the adding value as an upper limit of the control range.

7. The ultrasonic actuator of claim 1, wherein the control section sets the driving frequency as an upper limit of the control range and performs duty control.

8. The ultrasonic actuator of claim 1, wherein the control section performs control for determining the control range of the driving frequency at each predetermined timing.

9. The ultrasonic actuator of claim 8, wherein the predetermined timing is a time when the ultrasonic actuator is started up.

10. The ultrasonic actuator of claim 8, wherein the predetermined timing is a time when a current value detected by the current detection section exceeds a predetermined threshold.

11. The ultrasonic actuator of claim 8, wherein the predetermined timing is a time when the control section receives a predetermined signal to instruct control for determining the control range of the driving frequency from outside thereof.

12. The ultrasonic actuator of claim 8, wherein the predetermined timing is a time when a power supply voltage of the power supply section is changed.

13. The ultrasonic actuator of claim 1, wherein the memory section further stores at least one of the reference frequency measured in advance, the upper limit of the control range determined in advance and the lower limit of the control range determined in advance based on the difference between the antiresonance frequency and the resonance frequency.

14. The ultrasonic actuator of claim 1, wherein the actuator body performs first mode of longitudinal vibration and second mode of bending vibration.

* * * * *